United States Patent
Lui et al.

(10) Patent No.: US 9,246,347 B2
(45) Date of Patent: Jan. 26, 2016

(54) BATTERY CHARGING CIRCUIT WITH SERIAL CONNECTION OF MOSFET AND AN ENHANCEMENT MODE JFET CONFIGURED AS REVERSE BLOCKING DIODE WITH LOW FORWARD VOLTAGE DROP

(71) Applicants: Sik Lui, Sunnyvale, CA (US); Wei Wang, Santa Clara, CA (US)

(72) Inventors: Sik Lui, Sunnyvale, CA (US); Wei Wang, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 32 days.

(21) Appl. No.: 14/101,529

(22) Filed: Dec. 10, 2013

(65) Prior Publication Data

US 2015/0162777 A1    Jun. 11, 2015

Related U.S. Application Data

(63) Continuation of application No. 12/893,978, filed on Sep. 29, 2010.

(51) Int. Cl.
*H01L 29/66* (2006.01)
*H02J 7/00* (2006.01)
*H01L 27/06* (2006.01)

(52) U.S. Cl.
CPC ........... *H02J 7/0072* (2013.01); *H01L 27/0629* (2013.01); *H02J 7/0052* (2013.01)

(58) Field of Classification Search
CPC .. H02J 7/0052; H01J 7/0072; H01L 27/0629; H01L 29/66325; H01L 29/7393
See application file for complete search history.

(56) References Cited

U.S. PATENT DOCUMENTS

| | | | |
|---|---|---|---|
| 7,064,407 B1 * | 6/2006 | Mallikarjunaswamy | H01L 27/0727 257/287 |
| 2009/0251197 A1 | 10/2009 | Friedrichs | |

FOREIGN PATENT DOCUMENTS

CN    201466752    5/2010

OTHER PUBLICATIONS

Office Action dated Aug. 13, 2015 of Chinese patent application No. 201410084356.8.
First Office Action issued in corresponding CN Patent Application 201410084356.8, dated Aug. 13, 2015.

* cited by examiner

*Primary Examiner* — Kyoung Lee

(57) ABSTRACT

A semiconductor die with integrated MOSFET and diode-connected enhancement mode JFET is disclosed. The MOSFET-JFET die includes common semiconductor substrate region (CSSR) of type-1 conductivity. A MOSFET device and a diode-connected enhancement mode JFET (DCE-JFET) device are located upon CSSR. The DCE-JFET device has the CSSR as its DCE-JFET drain. At least two DCE-JFET gate regions of type-2 conductivity located upon the DCE-JFET drain and laterally separated from each other with a DCE-JFET gate spacing. At least a DCE-JFET source of type-1 conductivity located upon the CSSR and between the DCE-JFET gates. A top DCE-JFET electrode, located atop and in contact with the DCE-JFET gate regions and DCE-JFET source regions. When properly configured, the DCE-JFET simultaneously exhibits a forward voltage Vf substantially lower than that of a PN junction diode while the reverse leakage current can be made comparable to that of a PN junction diode.

16 Claims, 26 Drawing Sheets

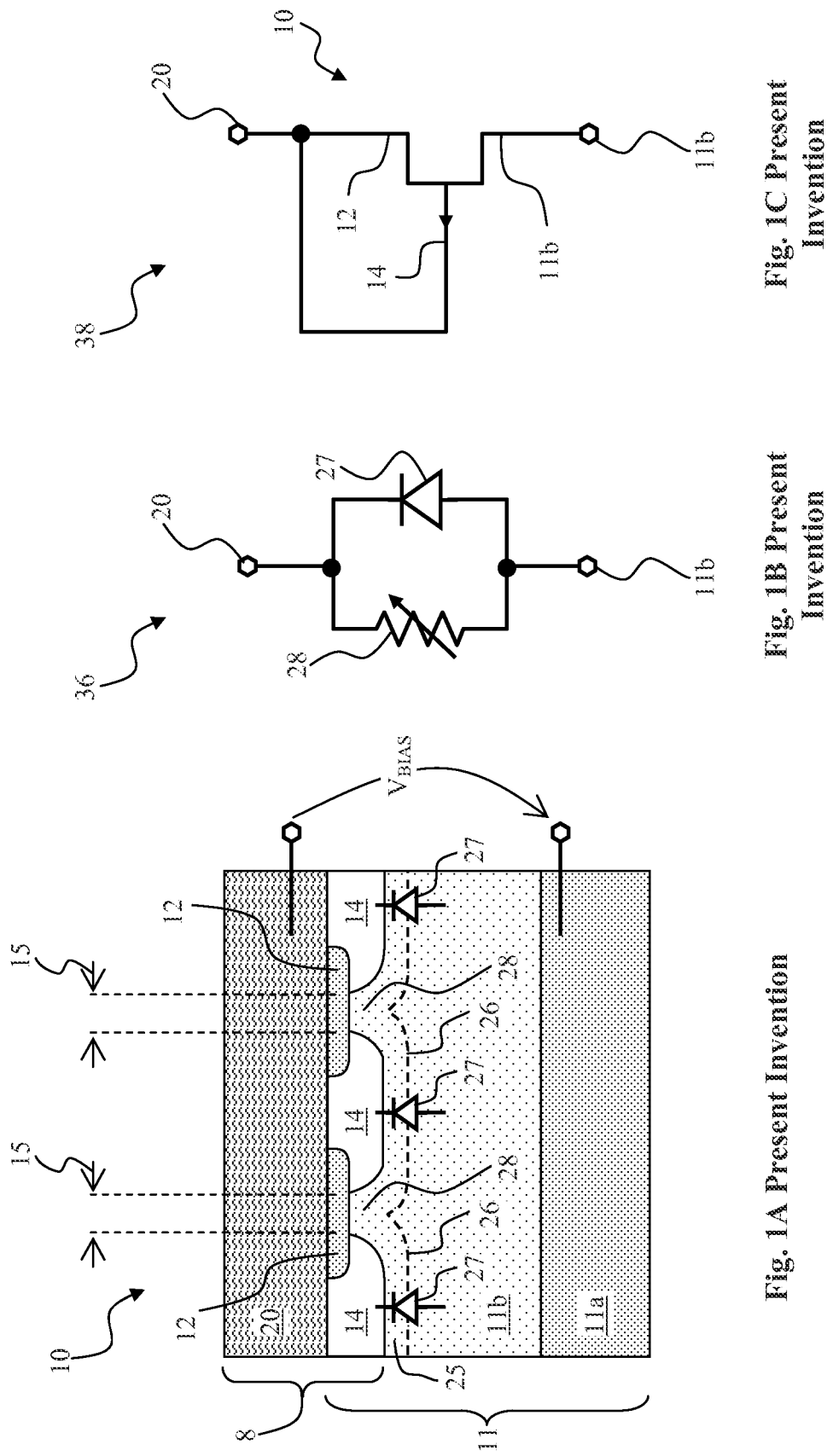

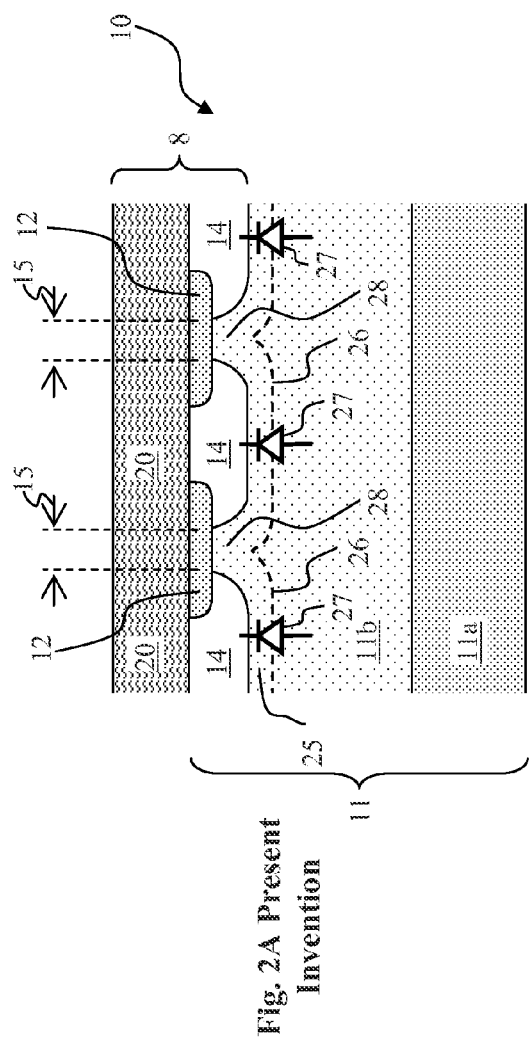
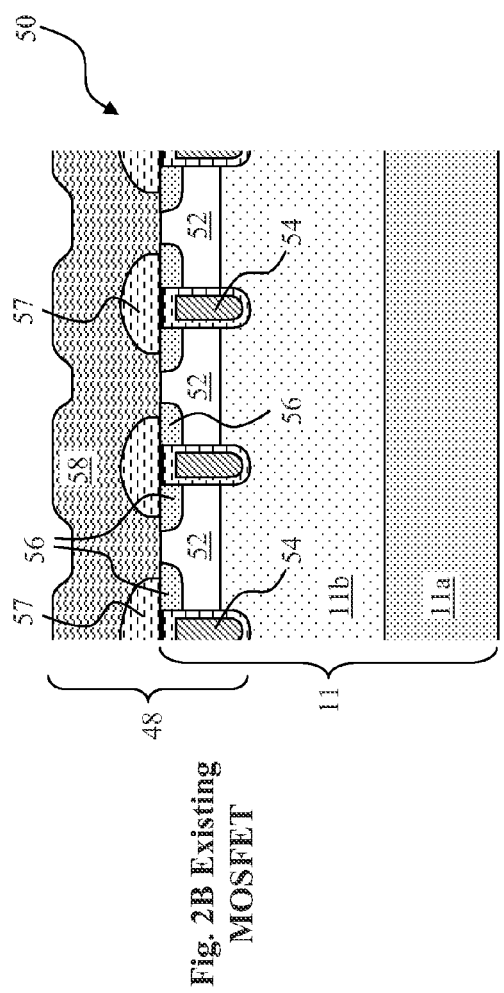
Fig. 2A Present Invention
Fig. 2B Existing MOSFET

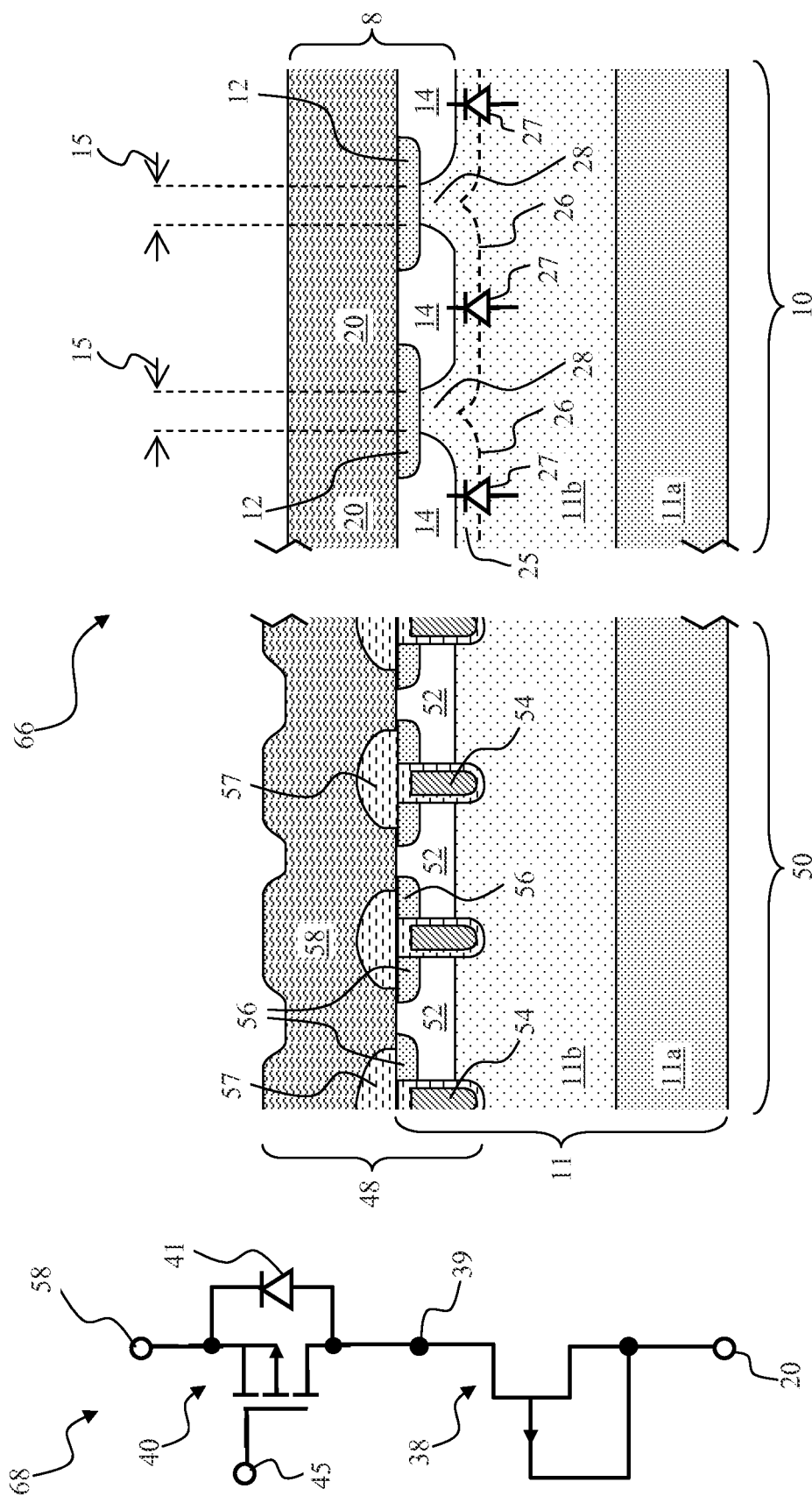
Fig. 3B Present Invention
Fig. 3A Present Invention

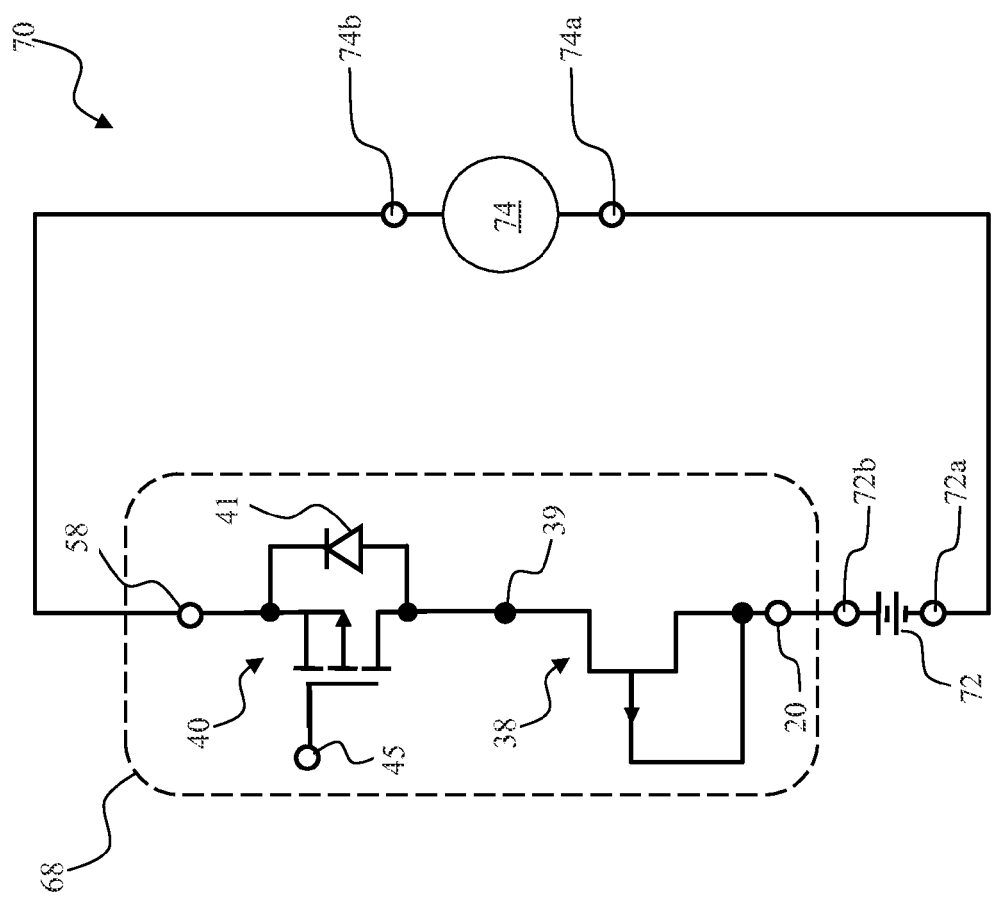

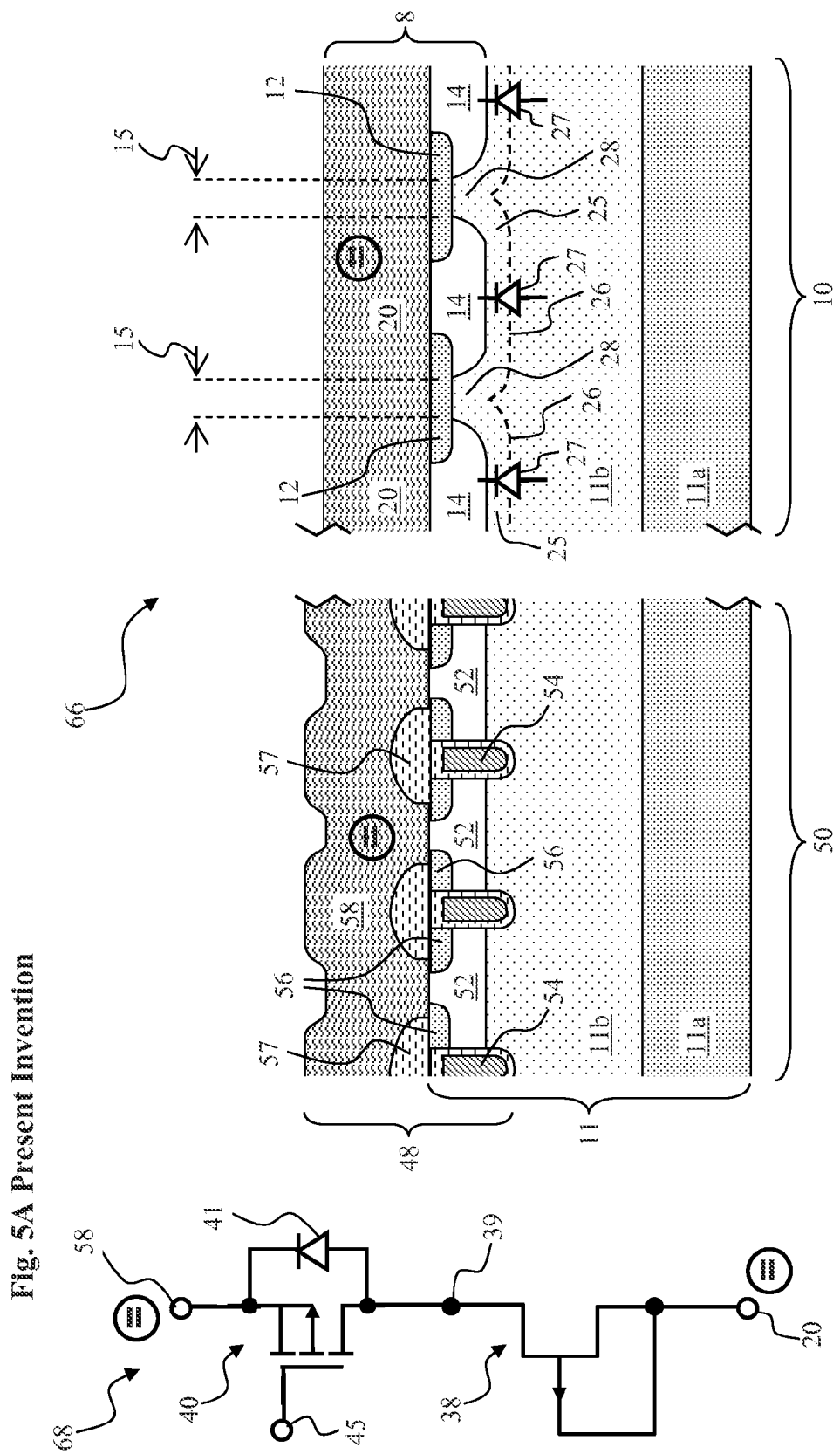
Fig. 5A Present Invention

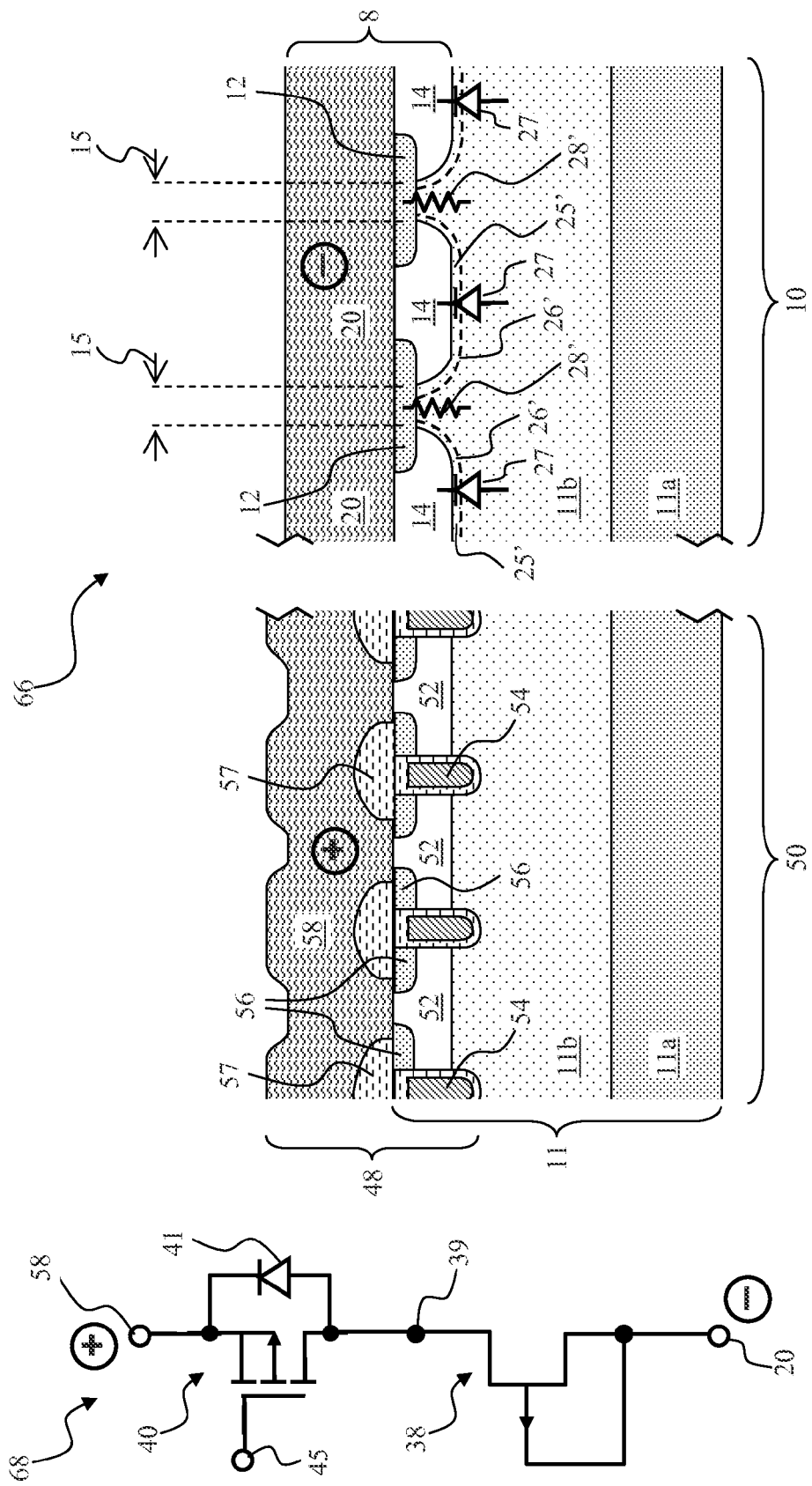
Fig. 5B Present Invention

Fig. 5C Present Invention

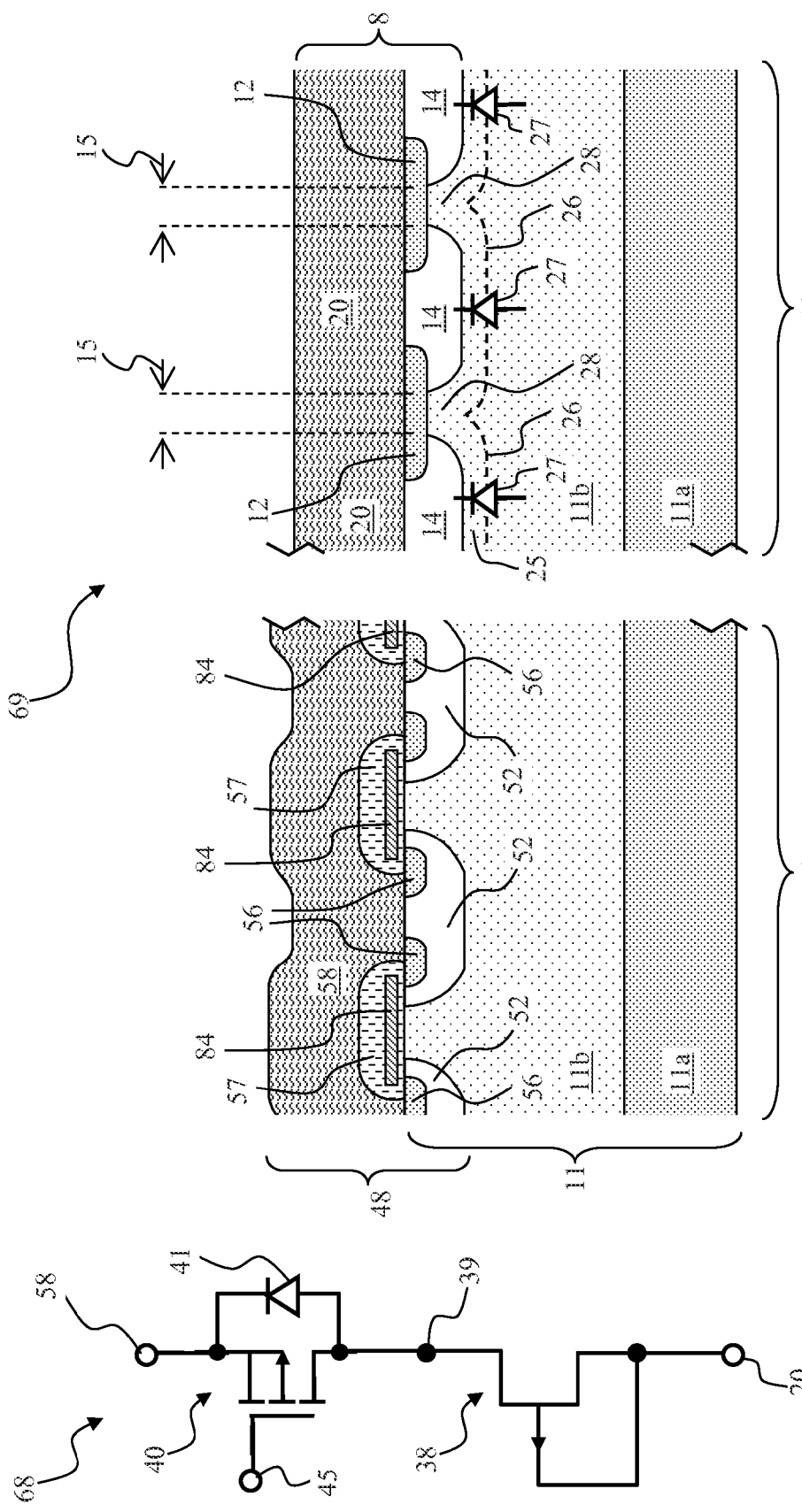

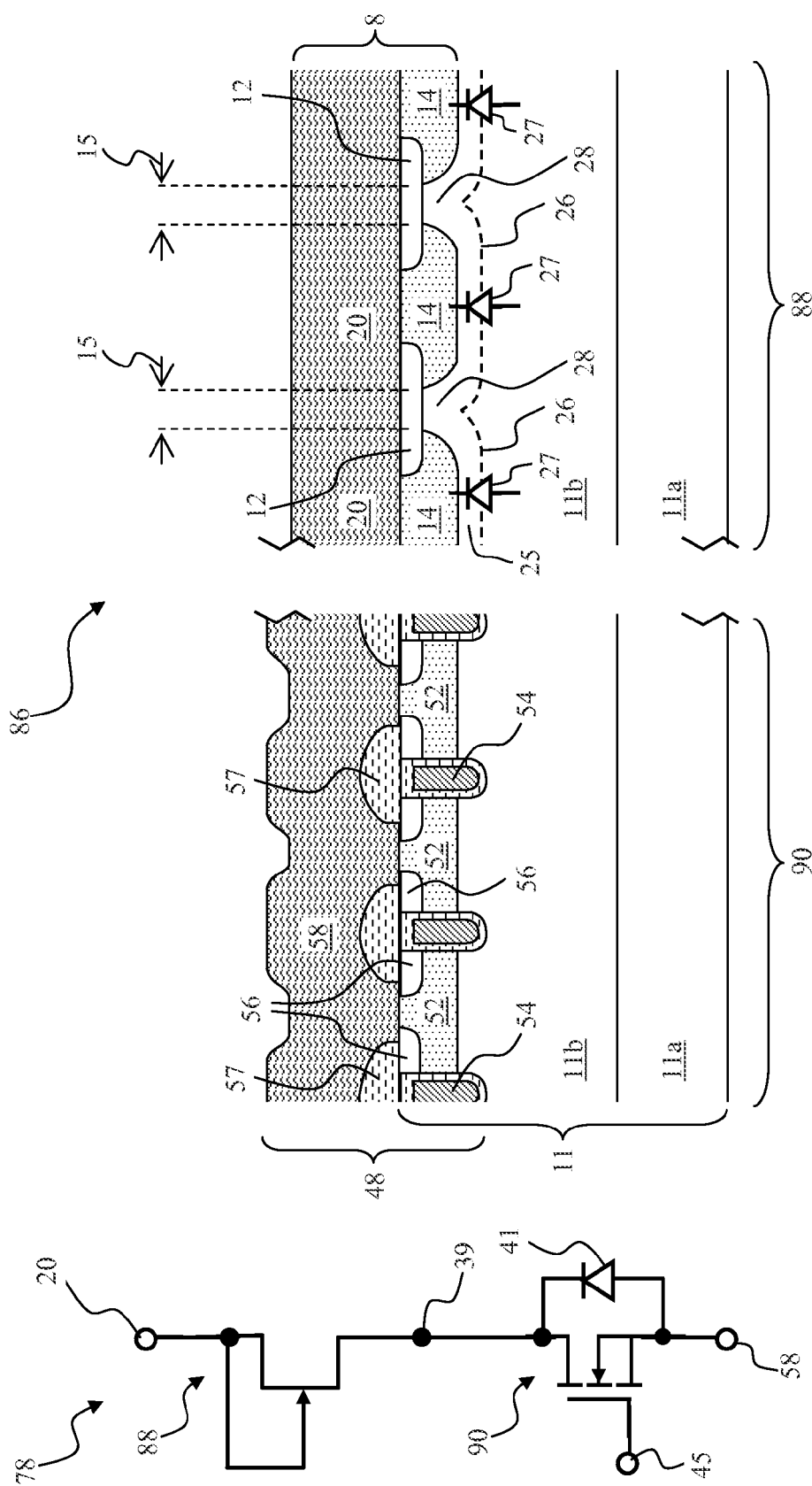

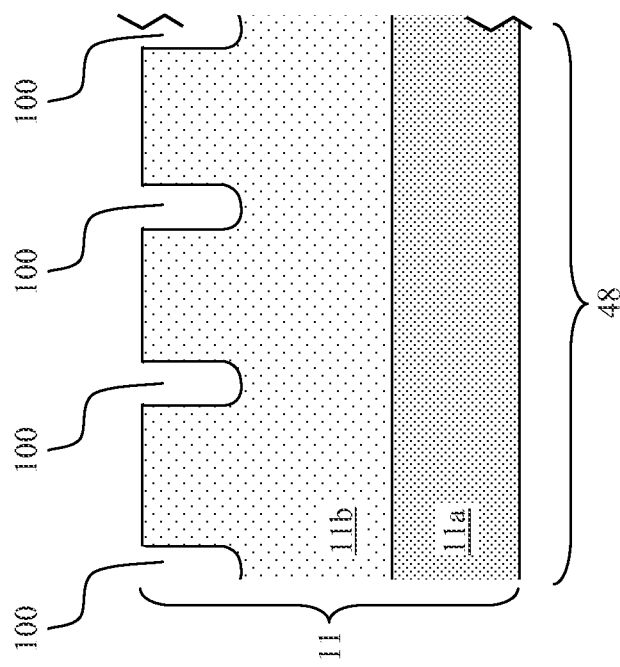
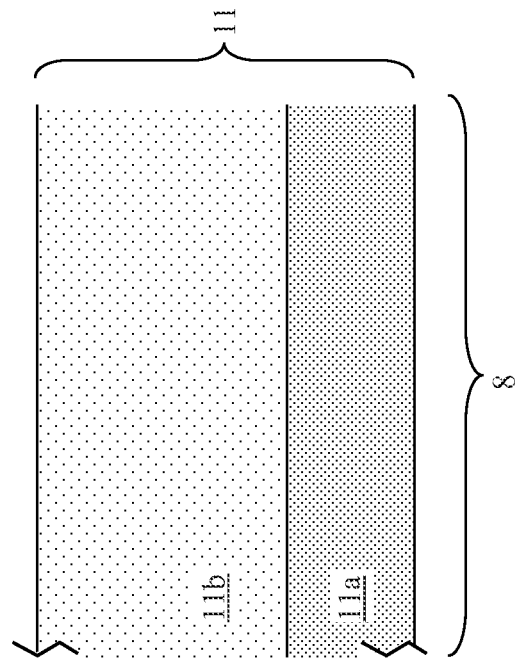

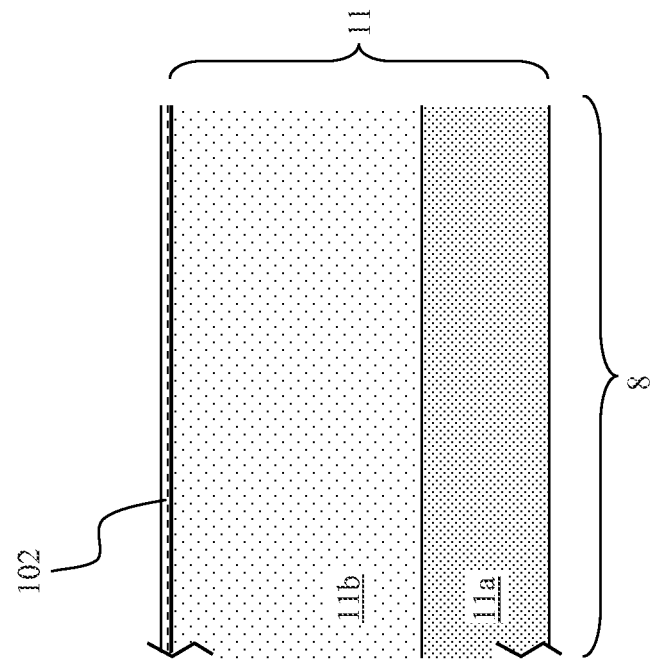
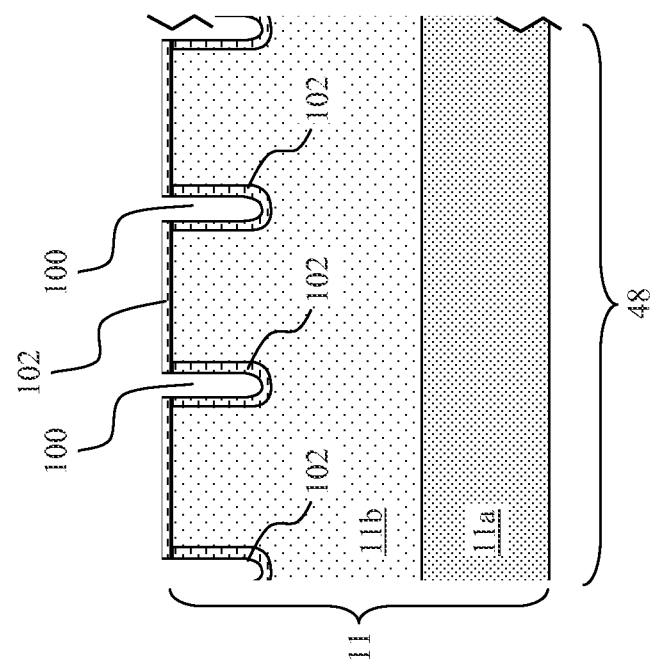

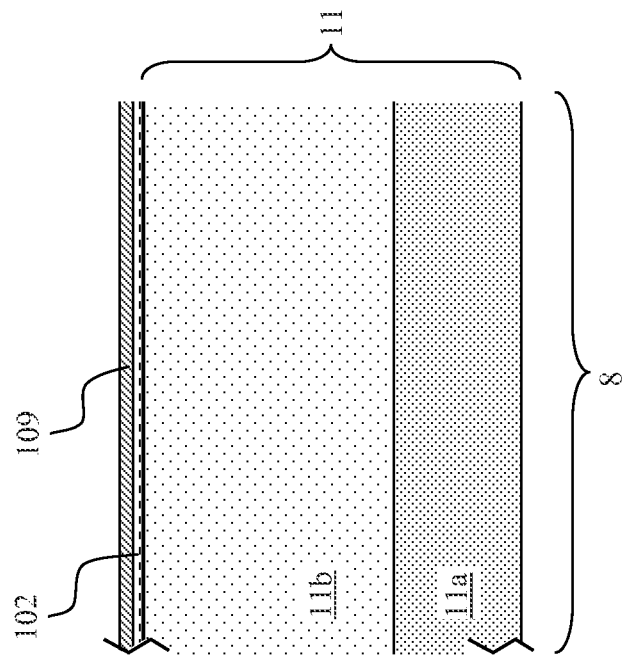
Fig. 8F Present Invention
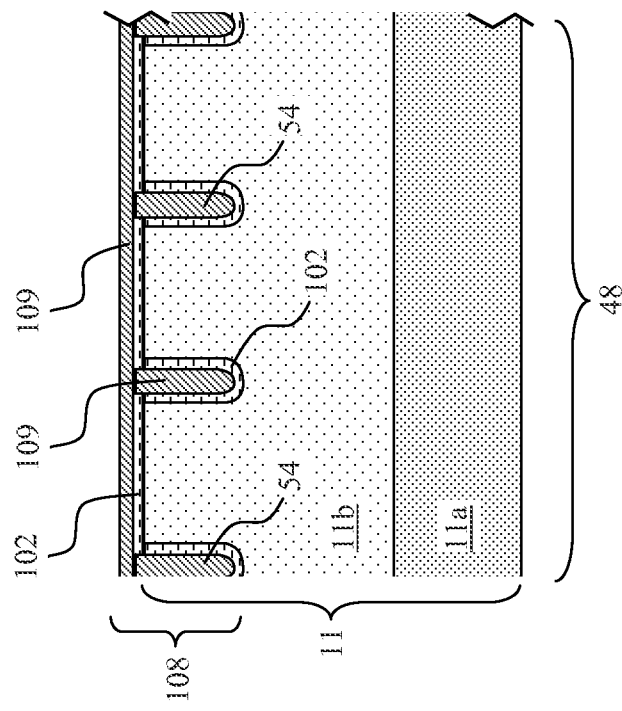
Fig. 8E Present Invention

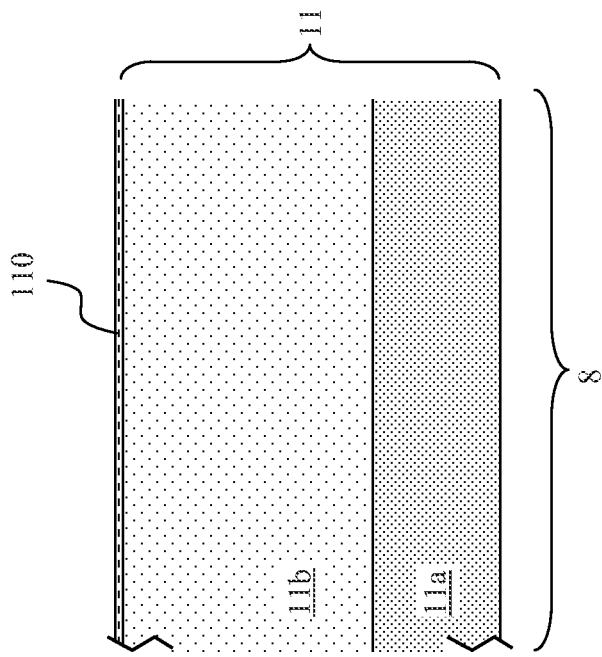
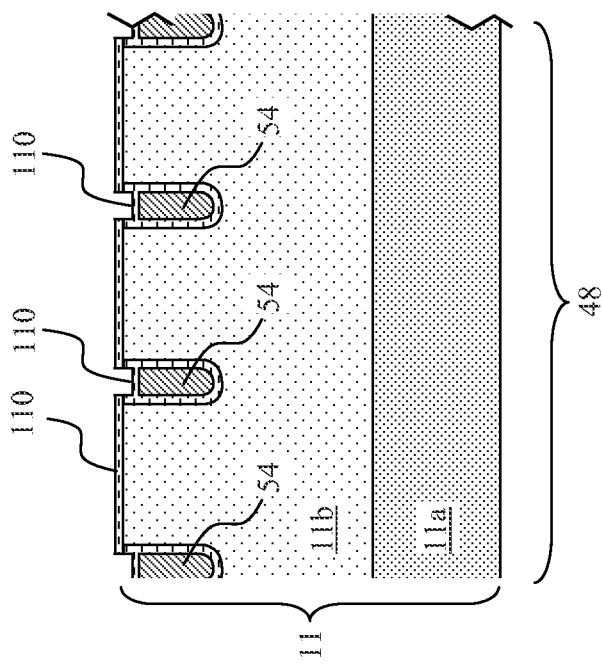

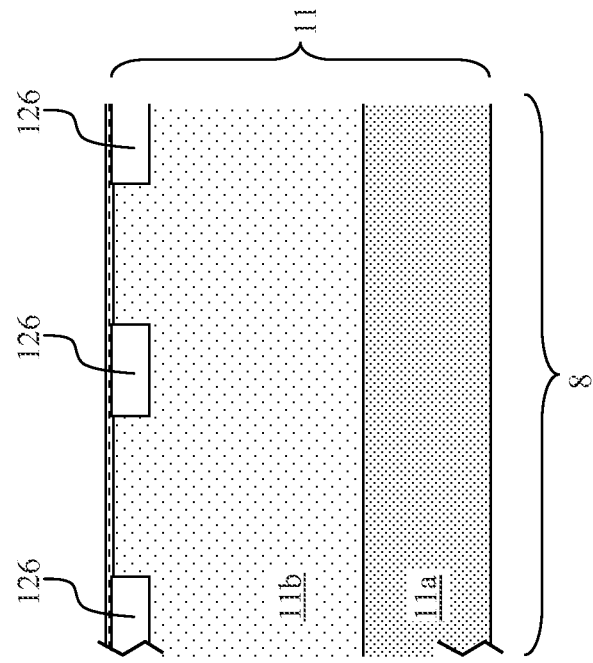
Fig. 8J Present Invention
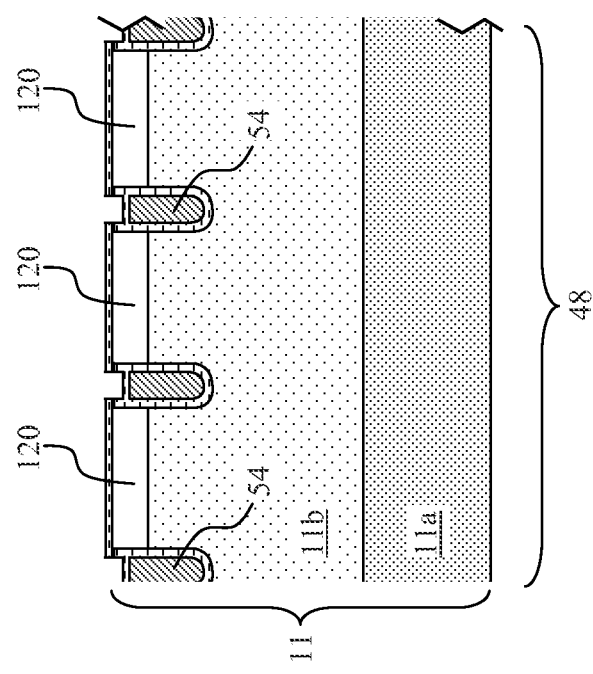
Fig. 8I Present Invention

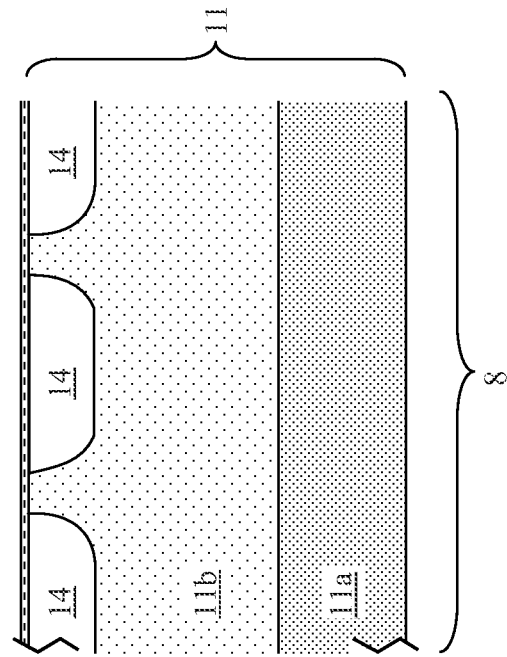
Fig. 8K Present Invention
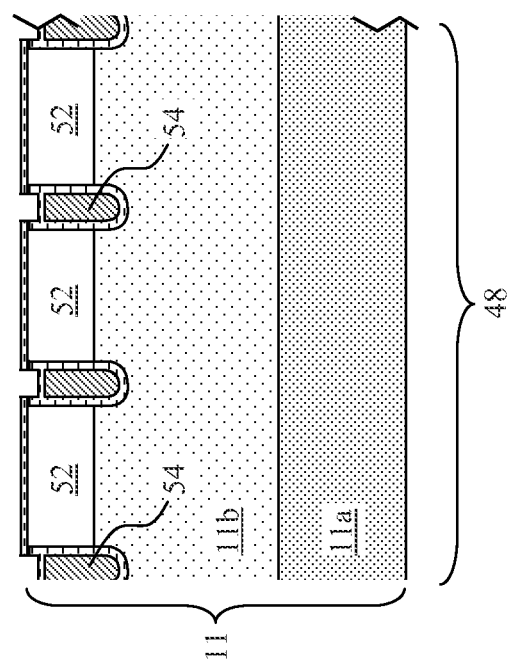
Fig. 8L Present Invention

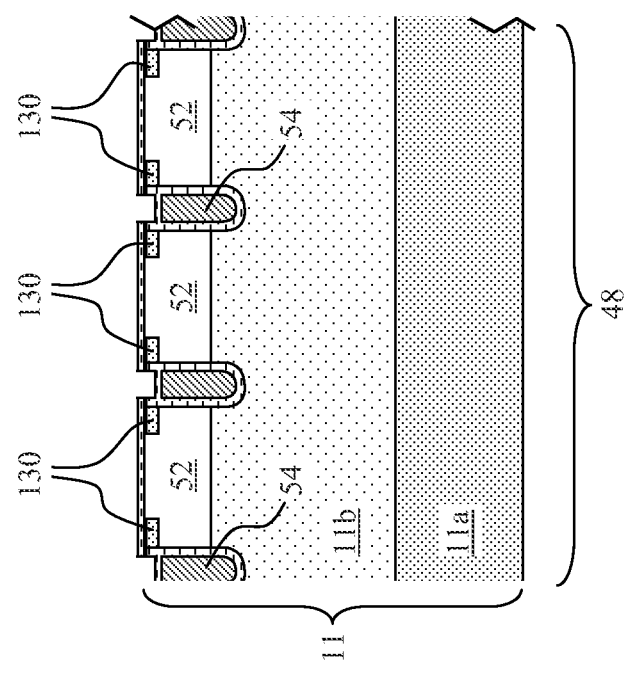
Fig. 8M Present Invention
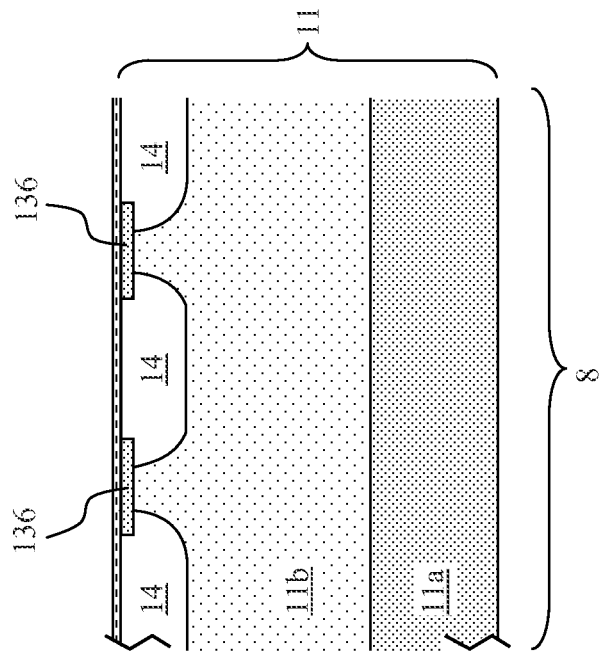
Fig. 8N Present Invention

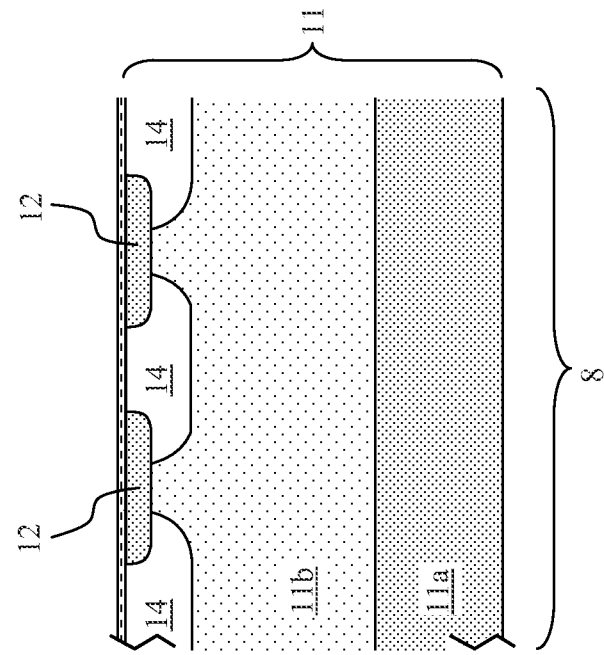
Fig. 8P Present Invention
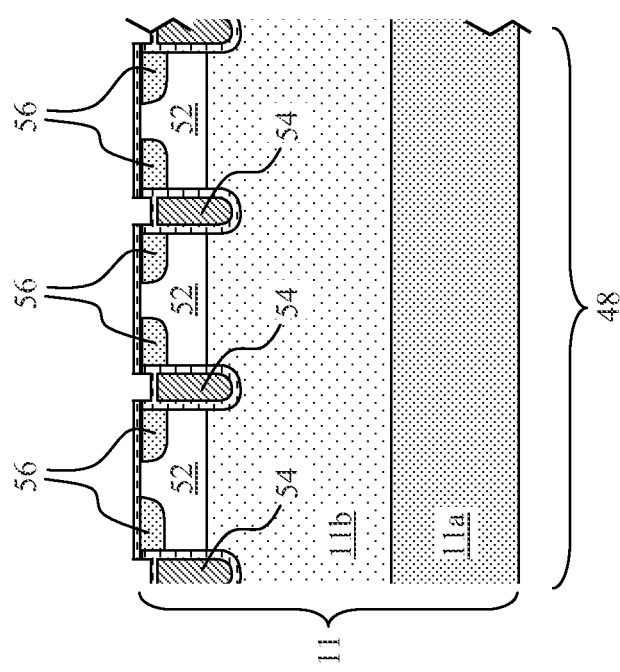
Fig. 8O Present Invention

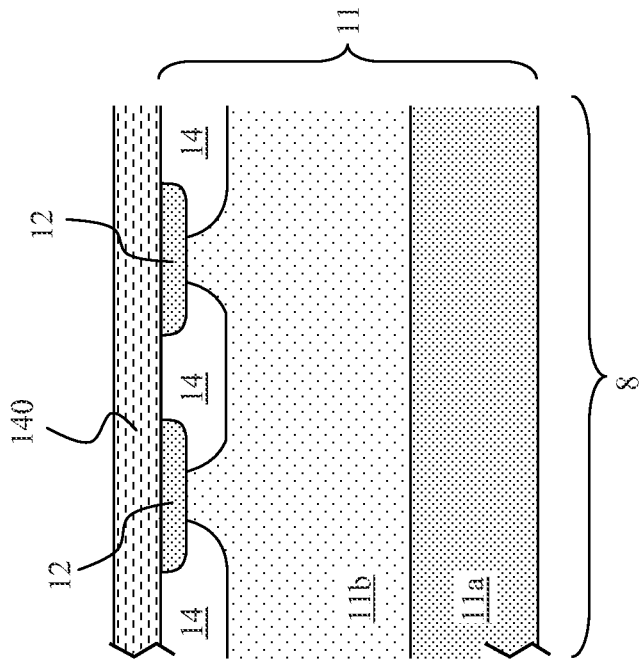
Fig. 8R Present Invention
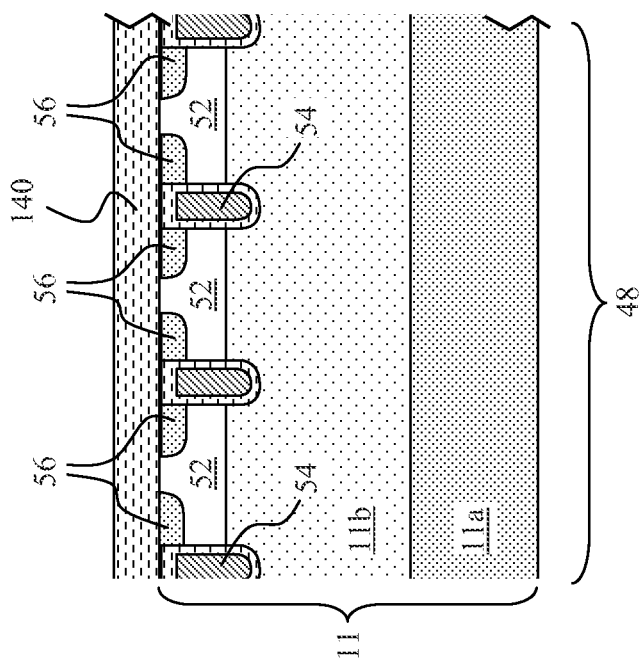
Fig. 8Q Present Invention

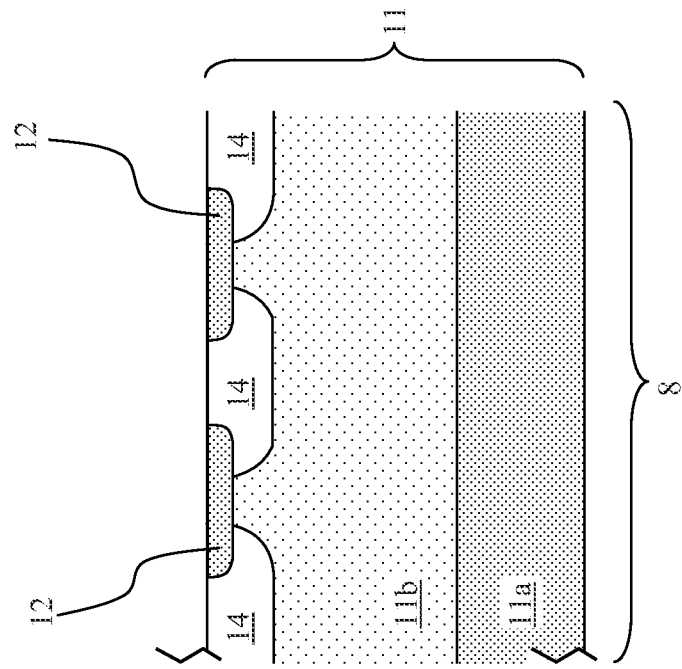
Fig. 8T Present Invention
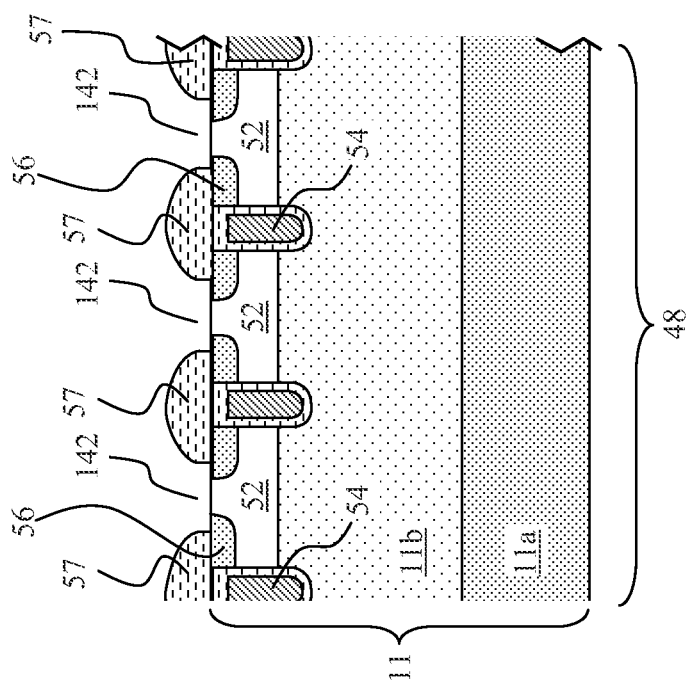
Fig. 8S Present Invention

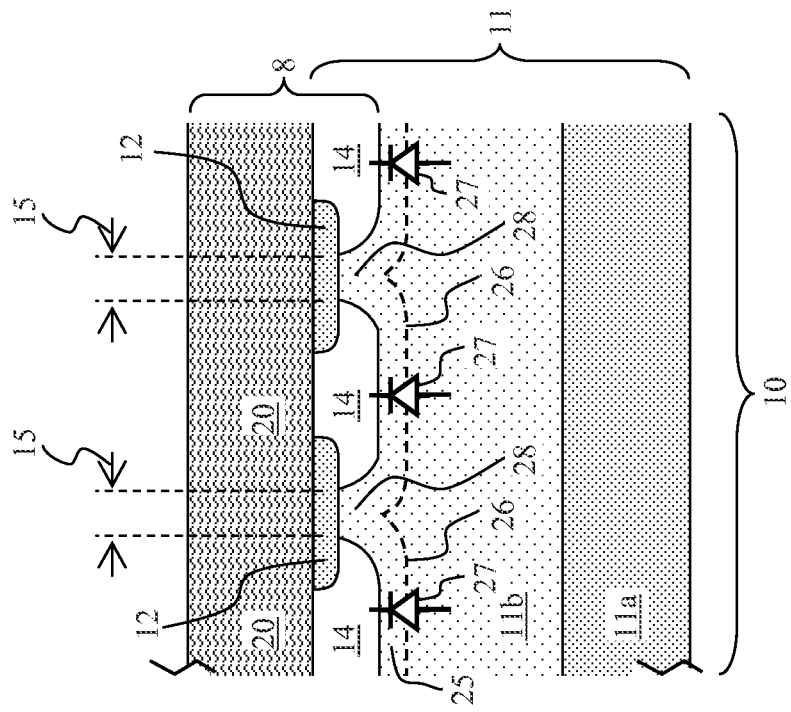
Fig. 8V Present Invention
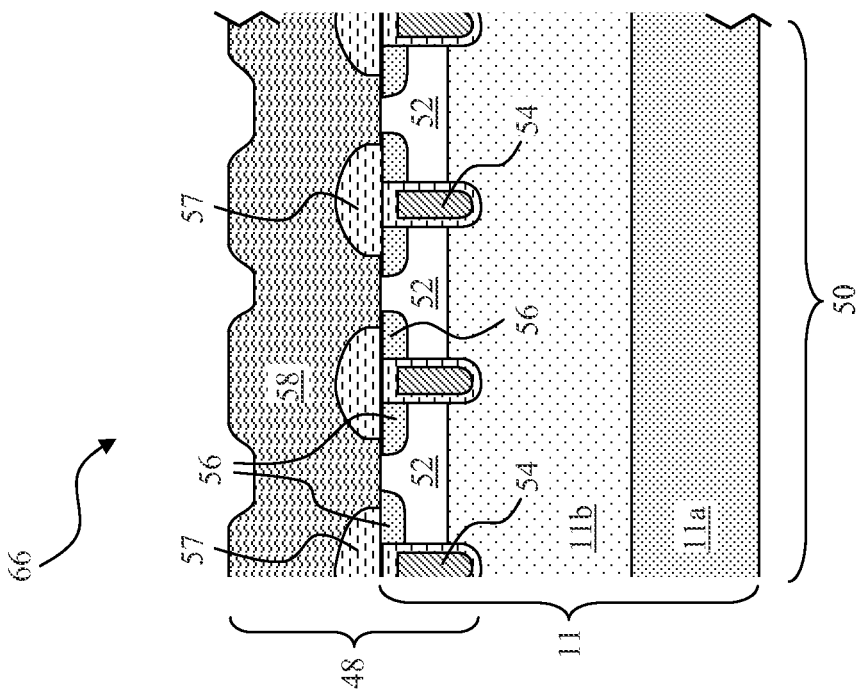
Fig. 8U Present Invention

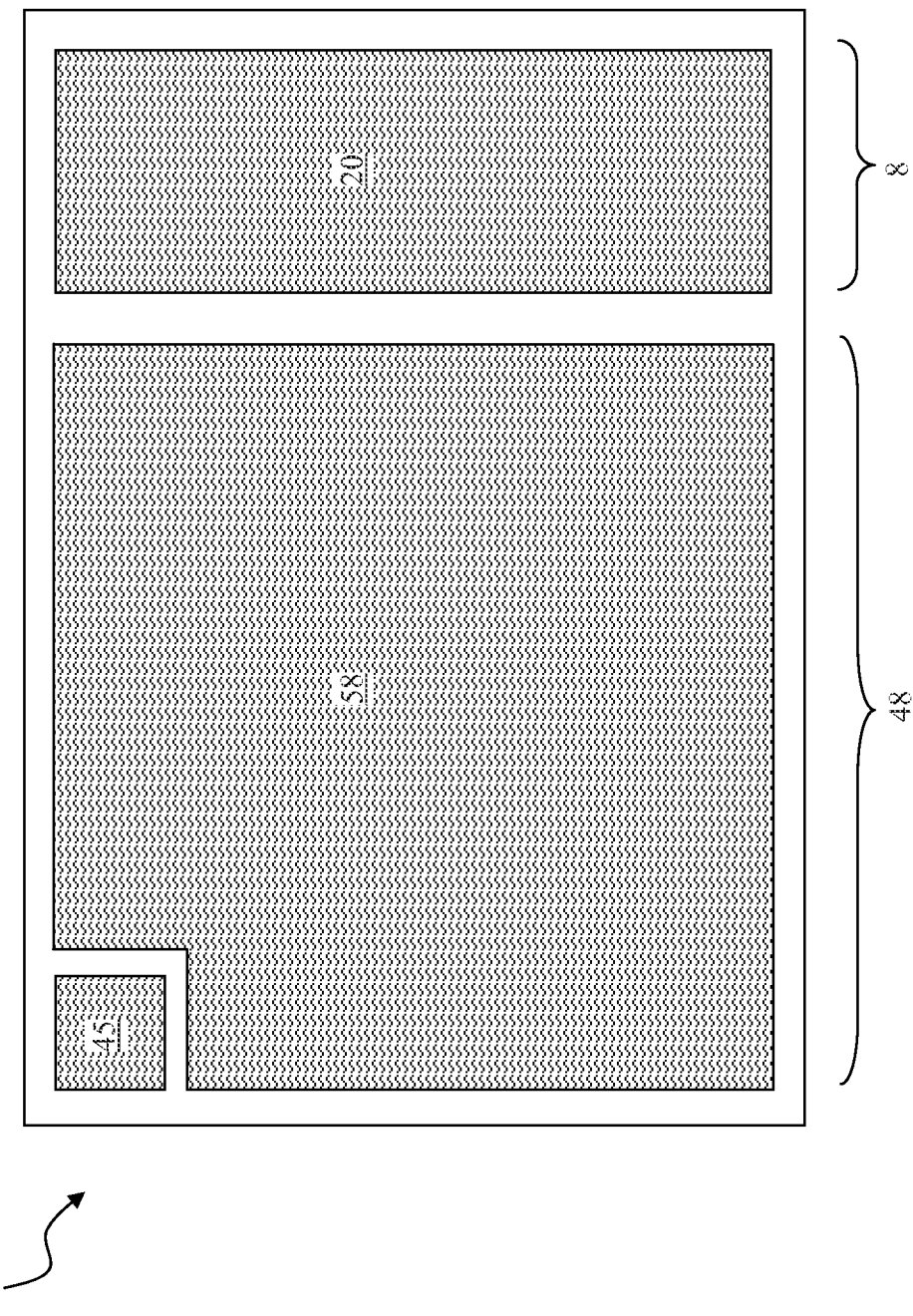

BATTERY CHARGING CIRCUIT WITH SERIAL CONNECTION OF MOSFET AND AN ENHANCEMENT MODE JFET CONFIGURED AS REVERSE BLOCKING DIODE WITH LOW FORWARD VOLTAGE DROP

CROSS-REFERENCE TO RELATED APPLICATIONS

This Patent Application is a Continuation Application of a co-pending application Ser. No. 12/893,978 filed on Sep. 29, 2010 by a common inventor of this Application. The Disclosure made in the patent application Ser. No. 12/893,978 is hereby incorporated by reference.

FIELD OF INVENTION

This invention relates generally to the field of semiconductor device structure. More specifically, the present invention is directed to device structure and manufacturing method to form an integrated power semiconductor device useful in a battery charging circuit.

BACKGROUND OF THE INVENTION

A prior art battery charging circuit 1, by way of example useful in cell phone battery charging application, is depicted in FIG. 10. A battery charging source Vcharge 1b is provided with its negative terminal connected to the negative terminal of a battery 1a. The positive terminal of the battery charging source Vcharge 1b is bridged to the positive terminal of the battery 1a with a serial connection of a Schottky diode $D_S$ 1f and a power Metal-Oxide-Semiconductor Field Effect Transistor (MOSFET) 1c, in this case a P-channel MOSFET, with a built-in body diode 1e and a gate control signal Vcontrol 1d. While in some situations the built-in body diode 1e is advantageous, for certain applications, such as the battery charging application, the body diode 1e can be a problem, as will be explained below. Under normal charging mode, the gate control signal Vcontrol 1d is lowered to turn on the power MOSFET 1c causing a charging current $I_{FORWARD}$ through the Schottky diode $D_S$ 1f and the power MOSFET 1c to charge the battery 1a. The charging process can be terminated by raising gate control signal Vcontrol 1d (for example, connecting the gate control signal 1d to the MOSFET 1c source voltage) till the power MOSFET 1c is turned off. However, in the absence of the Schottky diode $D_S$ 1f and upon an accidental short circuit of the battery charging source Vcharge 1b, the battery 1a can still be short circuited with a reverse current $I_{REVERSE}$ through the built-in body diode 1e even with the power MOSFET 1c turned off. Hence, the Schottky diode $D_S$ 1f also functions as a reverse blocking diode to prevent the battery 1a from an accidental short circuit. While a Schottky diode boasts the advantage of very short switching recovery time, it is remarked that for the application of battery charging the short switching recovery time is not a very important performance parameter. To those skilled in the art other types of diode can be used in lieu of the Schottky diode as well. However, the low forward voltage drop of the Schottky diode if is advantageous for energy efficiency in that it allows a correspondingly lower amount of wasted power dissipated from the diode during normal charging of the battery 1a.

FIG. 11 illustrates a prior art MOSFET-Schottky diode Co-package 2 corresponding to the serial connection of the Schottky diode $D_S$ 1e and the MOSFET 1c in circuit 1 of FIG. 10. The MOSFET-Schottky diode Co-package 2 has leads group 2f and leads group 2e for external connection. The Co-package 2 has to provide a Die pad one 2a for seating MOSFET die 2c and a Die pad two 2b for seating Schottky diode die 2d. Additionally, the Co-package 2 has to provide bond wire group 2g and bond wire group 2h for connecting both the Schottky diode die 2d and the MOSFET die 2c to the leads group 2f. The leads group 2e extends from die pad one 2a and die pad two 2b. With two die pads (2a and 2b) and two dies (2c and 2d), the MOSFET-Schottky diode Co-package 2 undesirably incurs a large overall package size and associated high assembly cost and high manufacturing cost. Therefore, it is desirable to integrate the serial connection of Schottky diode $D_S$ 1f and power MOSFET 1c of FIG. 10 into one semiconductor die for reduced package size with a single lead frame and lowered assembly cost and lower manufacturing cost.

FIG. 12 is a copy of FIG. 12A from U.S. Pat. No. 6,476,442, from now on referred to as U.S. Pat. No. 6,476,442. In U.S. Pat. No. 6,476,442 the Schottky Diode is replaced with a Pseudo-Schottky Diode. An N-channel MOSFET is fabricated with its source, body and gate connected together and biased at a positive voltage with respect to its drain. The resulting two-terminal device, referred to as a "pseudo-Schottky mode", functions like a diode but has a lower turn-on voltage than a conventional PN diode. In particular, FIG. 12 illustrates a cross-sectional view showing the structure of one embodiment of a pseudo-Schottky diode 1200 formed in a lateral configuration. A P-epitaxial layer 1204 is grown upon a P+ substrate 1202 using conventional techniques. A P+ body contact 1206 and an N+ source 1208 are shorted by a metal source/body contact 1218. A gate 1216 is also connected to the source/body contact 1218 into a node labeled S/B/G (A), thus making the source/body contact 1218 the anode of pseudo-Schottky diode 1200. A metal drain contact 1214, which connects to the N+ drain 1212, is the cathode of pseudo-Schottky diode 1200 with its contact node labeled D (K), thus making the drain contact 1214 the cathode of pseudo-Schottky diode 1200. An N-drift region 1210 is located adjacent N+ drain 1212.

Thus, FIG. 13A and FIG. 13B, respectively copied from FIGS. 4A and 4B of U.S. Pat. No. 6,476,442, compare the drain-to-source current Id versus drain to source voltage Vds characteristics of a MOSFET having its gate shorted to its drain in Quadrant I operation with that of a pseudo-Schottky diode (i.e., a device which exhibits the pseudo-Schottky effect) in Quadrant III operation. The curve designated PS relates to the pseudo-Schottky diode, and the curve designated M relates to the MOSFET. In both cases, the gate of the MOSFET is tied to the more positive terminal of the MOSFET. FIG. 4A shows that due to the lower turn-on voltage of the pseudo-Schottky diode, the I-V curve of the pseudo-Schottky diode is shifted towards the origin. FIG. 4B is the same as FIG. 4A but plots the log of Id to afford a wider range of comparison of the currents, particularly in the subthreshold region of drain-to-source voltage Vds. In section A, only leakage current is passing through both the pseudo-Schottky diode and the MOSFET, and therefore the currents are approximately equal. In section B of the graph, the pseudo-Schottky diode has turned on; therefore, the pseudo-Schottky current is much larger than the MOSFET current. In section C, the MOSFET turns on and the body effect disappears so that the currents are once again closer together. It is noteworthy that Id is several orders of magnitude higher in the pseudo-Schottky diode than in the MOSFET when Vds is in the range 0.2-0.6 V.

In U.S. Pat. No. 6,734,715, hereinafter referred to as U.S. Pat. No. 6,734,715, a two terminal semiconductor circuit is described that can replace the semiconductor diodes used as rectifiers in conventional DC power supply circuits. A number of semiconductor circuits that can efficiently supply the DC currents required in both discrete and integrated circuits being operated at low DC supply voltages are disclosed. All of these circuits have a forward or current conducting state and a reverse or non current conducting state similar to a conventional semiconductor diode, but with lower forward on voltage $V_T$ and better current handling capabilities. In particular, FIG. 14A and FIG. 14B, respectively copied from FIG. 4 and FIG. 5 of U.S. Pat. No. 6,734,715, are illustrated here. FIG. 14A shows a two terminal device 400 formed by a direct connection 435 between the gate 420 and source 430 leads of an n-channel, asymmetrical, normally off JFET. The source 430 and the drain 410 form the two terminal device that can be represented by the diode equivalent 450. The anode lead 460 of the diode corresponds to the source lead 430 of the JFET, while the cathode lead 470 of the diode corresponds to the drain lead 410 of the JFET. FIG. 14B shows a two terminal circuit 500 formed by the connection of a transformer 505 and an n-channel, asymmetrical, normally off JFET 525. The source 530 and the drain 550 form the two terminal circuit that can be represented by the diode equivalent 570. The anode lead 580 of the diode corresponds to the source lead 530 of the JFET, while the cathode lead 590 of the diode corresponds to the drain lead 550 of the JFET.

The transformer primary 510 is connected between the source and drain of the JFET. One terminal of the secondary 520 is connected with a current limiting device 560 in series between it and the gate 540 of the JFET, and the other terminal of the secondary is connected to the source of the JFET. The current limiting device will prevent excessive current between the p-type gate structure and the n-type epitaxial region. The polarity dots 515 on the transformer illustrate the 180 degree phase shift between the transformer primary and secondary potential differences. The transformer is a step-up transformer wherein the secondary voltage is greater than the primary voltage by a factor of N, where N is defined as the ratio of secondary turns to primary turns.

In view of these prior arts, there is an ongoing need of:
replacing a conventional Schottky Diode with new types of diode having improved performance parameters; and
integrating the new diode with a power MOSFET at the semiconductor device die level for reduced package size and cost.

SUMMARY OF THE INVENTION

A semiconductor device die with integrated metal oxide semiconductor field effect transistor (MOSFET) and diode-connected enhancement mode junction field effect transistor (JFET) is proposed. The semiconductor device die may include two conduction nodes (or terminals) Terminal-S, Terminal-D and a control node (or terminal) Terminal-Gate. The MOSFET-JFET semiconductor device die includes:
A lower common semiconductor substrate region (CSSR) of type-1 conductivity.
A MOSFET device region located at the top of the CSSR. The MOSFET device region has:
 The CSSR as its MOSFET drain region.
 At least a MOSFET body region of type-2 conductivity, a MOSFET gate region and a MOSFET source region of type-1 conductivity located at the top of the MOSFET drain region.
A diode-connected enhancement mode JFET (DCE-JFET) device region located at the top of the CSSR. The DCE-JFET device region has:
 The CSSR as its DCE-JFET drain region.
 At least two DCE-JFET gate regions of type-2 conductivity located at the top of the DCE-JFET drain region and laterally separated from each other along the major CSSR plane with a DCE-JFET gate spacing.
 At least a DCE-JFET source region of type-1 conductivity located at the top of the CSSR and between the DCE-JFET gate regions, wherein the DCE-JFET source region is shorted to the DCE-JFET gate regions.
Thus, the CSSR serially connects the MOSFET device drain region to the DCE-JFET device drain region.

In a more specific embodiment, the MOSFET may further include:
 A top source electrode connected to the MOSFET source region as the Terminal-S. The DCE-JFET may further have:
 A top DCE-JFET electrode, located atop and in contact with the DCE-JFET gate regions and DCE-JFET source regions, as the Terminal-D.

In a more specific embodiment the MOSFET may further include:
 A top gate electrode connected to the MOSFET gate region as the Terminal-Gate.

In a more specific embodiment, conductivity level of the DCE-JFET gate regions, conductivity level of a DCE-JFET channel region between the DCE-JFET gate regions and under the DCE-JFET source region, and DCE-JFET gate spacing are all configured at their respectively pre-determined levels so as to make the DCE-JFET device simultaneously exhibit a sufficiently low forward voltage Vf and a sufficiently low reverse leakage current as an enhancement mode JFET. In particular, Vf can be made to be substantially lower than that of a PN junction diode while the reverse leakage current can be made comparable to that of a PN junction diode.

In a more specific embodiment for simplifying the manufacturing process of the MOSFET-JFET semiconductor device die:
 The dopant material, concentration and depth of the MOSFET body regions are selected to be the same as those of the DCE-JFET gate regions.
 The dopant material, concentration and depth of the MOSFET source regions are selected to be the same as those of the DCE-JFET source regions.
 To further simplify manufacturing the MOSFET-JFET die, material and thickness of the MOSFET top source electrode and top gate electrode are selected to be the same as those of the top DCE-JFET electrode.

In a more specific embodiment, the MOSFET gate regions are configured as trench gates extending downwards into the MOSFET body regions and the CSSR. In another more specific embodiment, the MOSFET gate regions are configured as planar gates located over the MOSFET body regions and bridging the MOSFET source regions to the CSSR.

In a more specific embodiment, the CSSR includes an upper layer of lower type-1 conductivity located on top of a lower substrate layer of higher type-1 conductivity.

As a more specific example, the type-1 conductivity is P-type and the type-2 conductivity is N-type making the MOSFET-JFET semiconductor device die a P-channel device. As an alternative example, the type-1 conductivity is N-type and the type-2 conductivity is P-type making the MOSFET-JFET semiconductor device die an N-channel device.

A battery charging circuit is proposed, it includes:
 A battery having a first battery terminal and a second battery terminal.

A battery charging source having a first charging terminal and a second charging terminal with the first charging terminal connected to the first battery terminal.

A serial connection of a MOSFET and an enhancement mode JFET for bridging the second charging terminal to the second battery terminal. The enhancement mode JFET is configured with its JFET source shorted to its JFET gate thus functions as a reverse blocking diode having a low forward voltage drop.

A method of making a semiconductor device die with integrated MOSFET and diode-connected enhancement mode JFET (DCE-JFET) is proposed. The semiconductor device die may have two conduction nodes (or terminals) Terminal-S, Terminal-D and a control node (or terminal) Terminal-Gate. The semiconductor device die also has a lower common semiconductor substrate region (CSSR) of type-1 conductivity with:

The MOSFET located at the top of the CSSR and having:
  The CSSR as its MOSFET drain region.
  At least a MOSFET body region of type-2 conductivity, a MOSFET gate region and a MOSFET source region of type-1 conductivity located at the top of the drain region. The MOSFET may also include a top source electrode connected to the MOSFET source region as the Terminal-S and a top gate electrode connected to the MOSFET gate region as the Terminal-Gate.

The DCE-JFET located at the top of the CSSR and having:
  The CSSR as its DCE-JFET drain region.
  At least two DCE-JFET gate regions of type-2 conductivity stacked atop the drain region and laterally separated from each other along the major CSSR plane with a DCE-JFET gate spacing. At least a DCE-JFET source region of type-1 conductivity stacked atop the CSSR between the DCE-JFET gate regions.
  The DCE-JFET may also include a top DCE-JFET electrode, located atop and in contact with the DCE-JFET gate regions and the DCE-JFET source region, as the Terminal-D.

The method includes:
  a) Provide the CSSR, partition its major plane into a MOSFET zone and a DCE-JFET zone then fabricate a MOSFET gate region in the MOSFET zone. Where the CSSR includes an upper layer of lower type-1 conductivity located on top of a lower substrate layer of higher type-1 conductivity, provide the CSSR involves:
    Provide a lower substrate layer of higher type-1 conductivity.
    Form an upper layer of lower type-1 conductivity atop the lower substrate layer.
  b) Create the MOSFET body region in the MOSFET zone and the DCE-JFET gate regions in the DCE-JFET zone.
  c) Create the MOSFET source region in the MOSFET zone and the DCE-JFET source region in the DCE-JFET zone.
  d) Short the DCE-JFET source region to the DCE-JFET gate regions.

In a more particular embodiment, the method may also include step(s) of:
  e) Form and pattern a top passivation layer atop the MOSFET zone with contact openings; and/or
  f) Form and pattern a top metallization layer. It includes: the top source electrode and the top gate electrode of the MOSFET; and the top DCE-JFET electrode, wherein the top DCE-JET electrode shorts the DCE-JFET source region to the DCE-JFET gate regions.

In a more particular embodiment, the method also includes configuring all of:
  conductivity level of the DCE-JFET gate regions, conductivity level of a DCE-JFET channel region between the DCE-JFET gate regions and under the DCE-JFET source region, and DCE-JFET gate spacing
at their respectively pre-determined levels such that the resulting DCE-JFET device exhibits a low forward voltage Vf that is substantially lower than that of a PN junction diode and a low reverse leakage current similar to that of a PN junction diode.

In a more specific embodiment, the MOSFET gate regions are configured as trench gates extending downwards into the MOSFET body regions and the CSSR. Correspondingly, fabricate a MOSFET gate region in the MOSFET zone involves:
  Form a trench mask on the top of CSSR that corresponds to the MOSFET gate region in the MOSFET zone whereas the trench mask covers up the CSSR in the DCE-JFET zone.
  Anisotropically etch, through the trench mask, the CSSR to form MOSFET gate trench then remove the trench mask.
  Form a gate dielectric layer in the gate trench.
  Deposit a conductive gate layer onto the gate dielectric layer.

In a more specific embodiment, forming the MOSFET gate region involves anisotropically etch back the conductive gate layer and the gate dielectric layer till the conductive gate layer separates into elemental MOSFET gate regions and the complete removal of the planar gate region.

In a more specific embodiment, the MOSFET gate regions are configured as planar gates located atop the MOSFET body regions. Correspondingly, forming the MOSFET gate region zone involves successively form a gate dielectric layer and a conductive gate layer upon the CSSR top surface. This may further involve:
  Form a gate mask on the top of conductive gate layer that corresponds to the MOSFET gate regions in the MOSFET zone whereas that exposes the conductive gate layer in the DCE-JFET zone.
  Anisotropically etch back, through the gate mask, the conductive gate layer and the gate dielectric layer till the conductive gate material separates into elemental MOSFET gate regions in the MOSFET region then remove the gate mask.

In a more detailed embodiment, create the MOSFET body region and the DCE-JFET gate regions involves:
  Make a first simultaneous implantation, with a first implantation mask, of first MOSFET implantation region in the MOSFET zone and first DCE-JFET implantation regions in the DCE-JFET zone.
  Simultaneously diffuse and activate the first MOSFET implantation region and the first DCE-JFET implantation regions respectively into the MOSFET body regions and the DCE-JFET gate regions.

In a more detailed embodiment, create the MOSFET source regions and the DCE-JFET source regions involves:
  Make a second simultaneous implantation, with a second implantation mask, of second MOSFET implantation region in the MOSFET zone and second DCE-JFET implantation region in the DCE-JFET zone.
  Simultaneously diffuse and activate the second MOSFET implantation region and the second DCE-JFET implantation region respectively into the MOSFET source region and the DCE-JFET source region.

In a more detailed embodiment, form and pattern a top metallization layer involves:

Deposit a top metal layer atop the MOSFET zone and the DCE-JFET zone.

Pattern the formed top metal layer, through a top metal mask, such that:

The portion of patterned top metal layer in the MOSFET zone corresponds to the desired top source electrode and top gate electrode.

The portion of patterned top metal layer in the DCE-JFET zone corresponds to the desired top DCE-JFET electrode.

These aspects of the present invention and their numerous embodiments are further made apparent, in the remainder of the present description, to those of ordinary skill in the art.

This invention can be applied to integrated circuit (IC) chips as well as to discrete power chips. The electrodes can be any sort of metal connection. The terminals refer to nodes in an electrical circuit, and are not limited to the metal electrodes of a discrete power device. Terminals can also refer to connection points of the DCE-JFET circuit within an IC chip.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 1A through FIG. 1C illustrate the cross sectional semiconductor die structure of a diode-connected enhancement mode junction field effect transistor (JFET) of the present invention together with its equivalent circuit and symbolic representation as a circuit component;

FIG. 2A and FIG. 2B illustrate the cross sectional semiconductor die structure of respectively the present invention diode-connected JFET and a MOSFET device;

FIG. 3A is a circuit schematic of serial connection of the present invention diode-connected JFET and a MOSFET device that, by way of example, can be deployed as part of a battery charging circuit;

FIG. 3B illustrates the cross sectional semiconductor die structure of an integrated trench gate MOSFET device and the present invention diode-connected JFET corresponding to the circuit schematic of FIG. 3A;

FIG. 4 illustrates the deployment of the circuit schematic of FIG. 3A into a battery charging circuit;

Figure 5C:
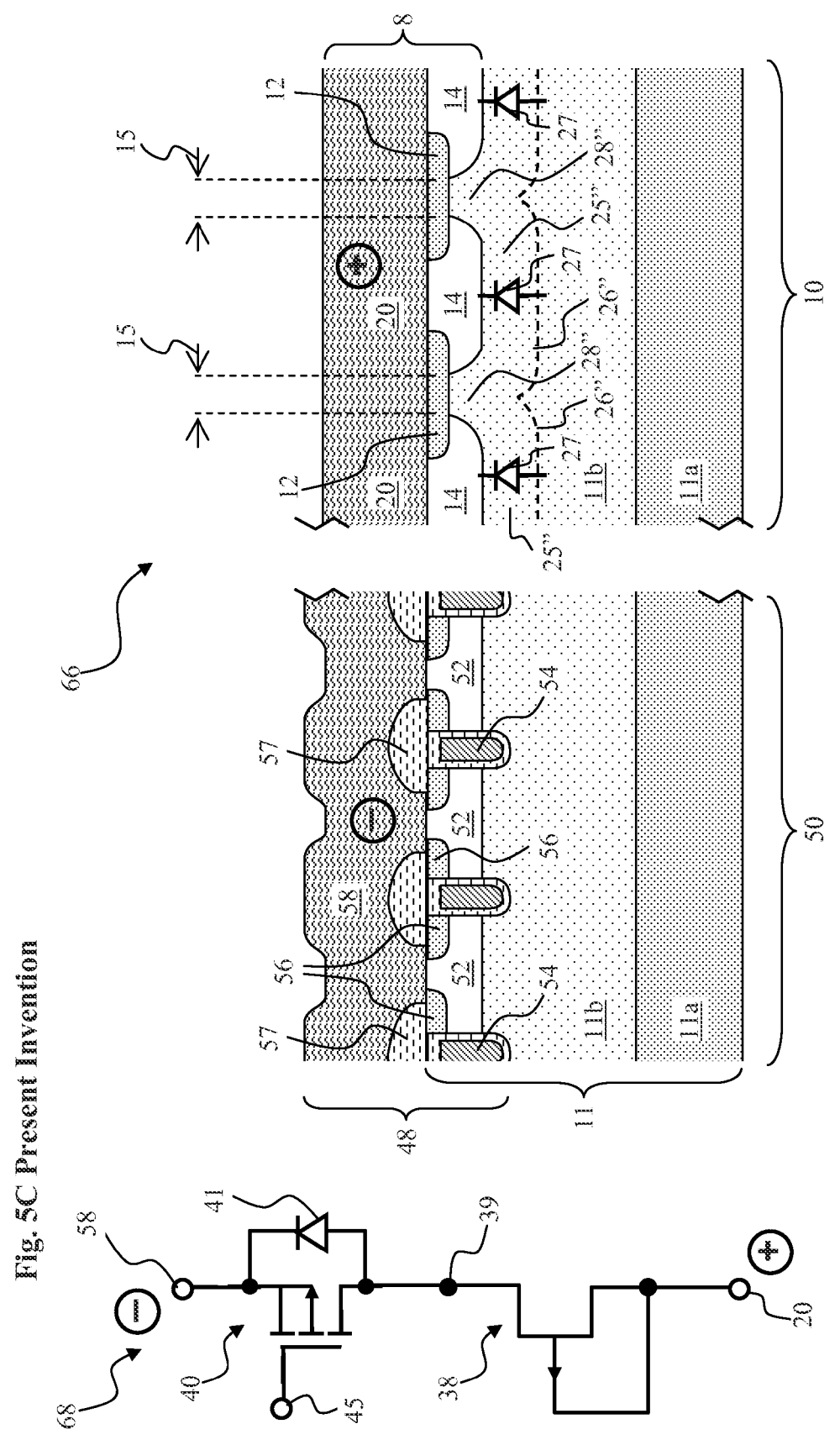

FIG. 5A through FIG. 5C illustrate the operation principle of the integrated trench gate MOSFET device and the present invention diode-connected JFET of FIG. 3B under various bias conditions;

FIG. 6A is a circuit schematic of serial connection of the present invention diode-connected JFET and a MOSFET device that can be deployed as part of a battery charging circuit;

FIG. 6B illustrates the cross sectional semiconductor die structure of an integrated planar gate MOSFET device and the present invention diode-connected JFET corresponding to the circuit schematic of FIG. 6A;

FIG. 7A is a circuit schematic of serial connection of the present invention diode-connected N-channel JFET and an N-channel MOSFET device that can be deployed as part of a battery charging circuit;

FIG. 7B illustrates the cross sectional semiconductor die structure of an integrated trench gate N-channel MOSFET device and the present invention diode-connected N-channel JFET corresponding to the circuit schematic of FIG. 7A;

FIG. 8A through FIG. 8V illustrate the semiconductor die fabrication process for the integrated trench gate MOSFET device and the present invention diode-connected JFET of FIG. 3B; and FIG. 9 illustrates a simplified top view of the integrated trench gate MOSFET device and the present invention diode-connected JFET of FIG. 3B;

DETAILED DESCRIPTION OF SPECIFIC EMBODIMENTS

Figure 10:
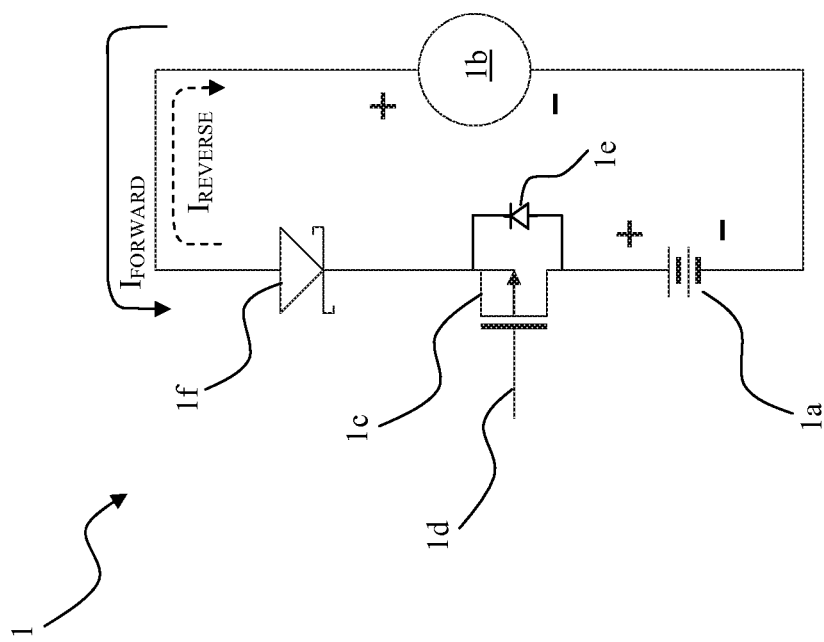
FIG. 10 depicts a prior art battery charging circuit.
Figure 11:
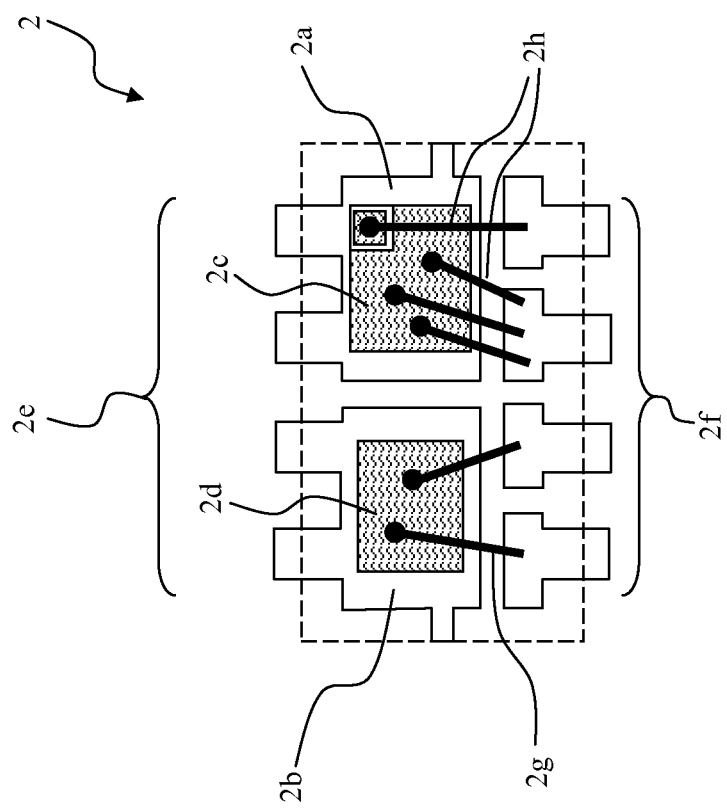
FIG. 11 illustrates a prior art MOSFET-Schottky diode Co-package of a Schottky diode and a MOSFET like that in FIG. 10.
Figure 12:
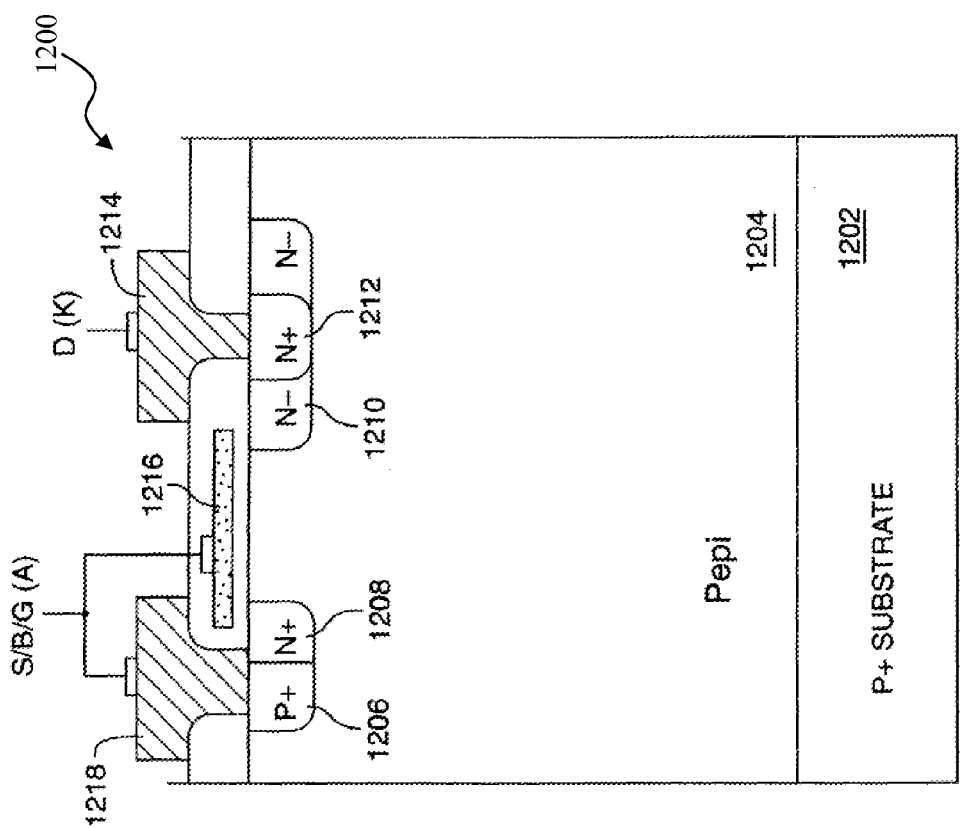
FIG. 12 is a copy of FIG. 12A from a prior art U.S Pat. No. 6,476,442.
Figure 13B:
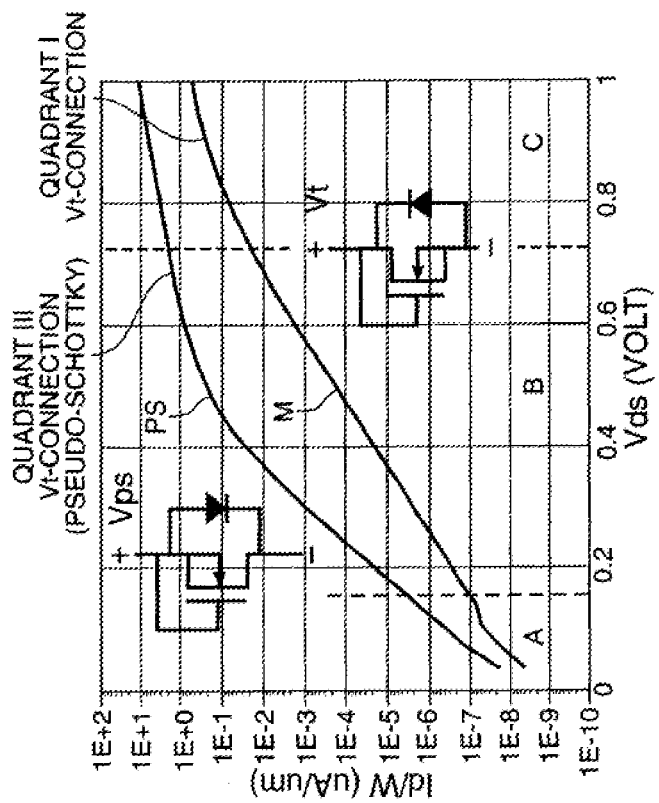
FIG. 13B is a copy of FIG. 4B from a prior art U.S Pat. No. 6,476,442.
Figure 13A:
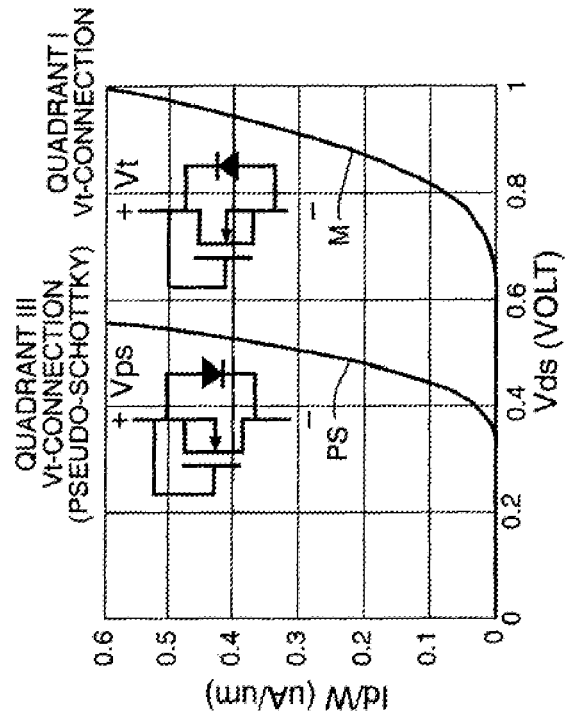
FIG. 13A is a copy of FIG. 4A from a prior art U.S Pat. No. 6,476,442.
Figures 14A, 14B:
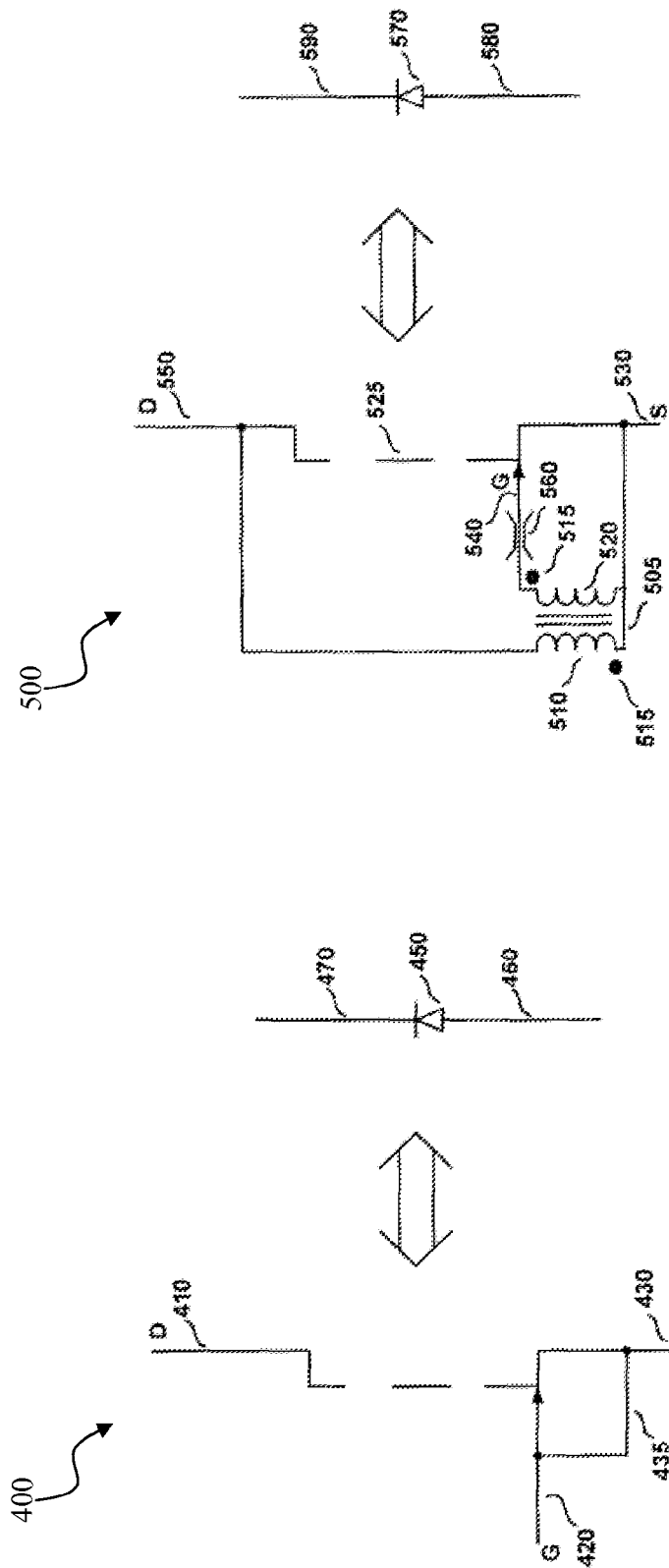
FIG. 14A is a copy of FIG. 4 from a prior art U.S Pat. No. 6,734,715.
FIG. 14B is a copy of FIG. 5 from a prior art U.S Pat. No. 6,734,715.

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 1A through FIG. 1C illustrate the cross sectional semiconductor die structure of a diode-connected P-channel enhancement mode junction field effect transistor (DCE-JFET) 10 of the present invention, together with its simplified equivalent circuit 36 and P-channel DCE-JFET circuit representation 38. A DCE-JFET device region 8 is located at the top of a lower common semiconductor substrate region (CSSR) 11 of P-type conductivity. In this embodiment, the CSSR 11 includes an upper p-epitaxy region 11$b$ of lower conductivity located on top of a lower P+ substrate region 11$a$ of higher conductivity. The DCE-JFET device region 8 has:

the CSSR 11 as its DCE-JFET drain region;

numerous N-type DCE-JFET gate regions 14 located at the top of the CSSR 11. Laterally, the neighboring DCE-JFET gate regions 14 are separated from each other along the major CSSR 11 plane with a DCE-JFET gate spacing GTSP 15;

numerous P-type (in this case P+) DCE-JFET source regions 12 located at the top of the CSSR 11 and between the N-type DCE-JFET gate regions 14; and a top DCE-JFET electrode 20, located atop and in contact with the DCE-JFET gate regions 14 and the DCE-JFET source regions 12, as Terminal-D.

As a result, a number of equivalent P-N junction diode elements 27 are formed between the N-type DCE-JFET gate regions 14 and the p-epitaxy region 11$b$. At the p-epitaxy region 11$b$ side of the interface of p-epitaxy region 11$b$ and N-type DCE-JFET gate regions 14, the equivalent P-N junction diode elements 27 have a built-in CSSR depletion zone 25 with a CSSR depletion zone boundary 26. Furthermore, a number of JFET channel element zones 28 are also formed in the P-epitaxy layer 11b between neighboring N-type DCE-JFET gate regions 14, with the JFET channel element zones 28 acting primarily as resistive current paths shunting the equivalent P-N junction diode elements 27. The conductivity of the JFET channel element zones 28 depends upon the coverage of their neighboring CSSR depletion zones 25. In the state shown in FIG. 1A, the CSSR depletion zones 25 completely deplete the JFET channel element zones 28, thus pinching shut the JFET channel. However, if the coverage of the CSSR depletion zones 25 should become sufficiently smaller, the JFET channel element zones 28 will open up and allow conduction, as will be shown later.

As will be presently described, the equivalent JFET channel resistance of the JFET channel element zones 28 is controlled by a bias voltage, $V_{BIAS}$, across the p+ substrate region 11a and Terminal-D 20. Specifically, a higher $V_{BIAS}$ results in smaller CSSR depletion zones 25 and lower equivalent JFET channel resistance. Therefore, the DCE-JFET simplified equivalent circuit 36 of FIG. 1B is a parallel connection of an equivalent P-N junction diode 27 and an equivalent variable JFET channel resistance 28. With this understanding, the diode-connected enhancement mode junction field effect transistor (DCE-JFET) 10 can be conveniently represented by a P-channel DCE-JFET circuit representation 38 of FIG. 1C having a P-source 12, an N-gate 14 and a P-drain 11b with P-source 12 and N-gate 14 tied together.

FIG. 2A and FIG. 2B illustrate the cross sectional semiconductor die structure of respectively the present invention DCE-JFET 10 and a basic, existing Metal-Oxide-Semiconductor Field Effect Transistor (MOSFET) device 50 with trench gates. Like the DCE-JFET 10, a MOSFET device region 48 of the Metal-Oxide-Semiconductor Field Effect Transistor (MOSFET) 50 is also located at top of the CSSR 11 that acts as the MOSFET drain region. Additionally, as is known in the art, the MOSFET device region 48 has:

Numerous MOSFET N-type body regions 52, numerous MOSFET trenched gate regions 54 and numerous MOSFET P-type source regions 56 located at top of the CSSR 11 with the trenched gate regions 54 extending downwards through the N-type body regions 52 and into the CSSR 11.

A top source electrode 58 connected to the numerous MOSFET P-type source regions 56 and to the numerous MOSFET N-type body regions 52 as a Terminal-S and a top gate electrode (not visible in this cross section) connected to the numerous MOSFET trenched gate regions 54 as a Terminal-Gate 45 (see FIG. 9 later). For those skilled in the art, the Terminal-Gate 45 is invisible in this cross sectional view as it makes connection to the MOSFET trenched gate regions 54 in a region perpendicular to the paper plane.

Numerous top passivation layers 57, located on top of the MOSFET trenched gate regions 54 and MOSFET source regions 56, with contact openings for the top source electrode 58.

A visual comparison of FIG. 2A and FIG. 2B reveals substantial structural similarity between the DCE-JFET 10 and the MOSFET 50 at semiconductor die level thus allowing for effective integration of these two devices into a single semiconductor device die.

Turning now to FIG. 3A that is a circuit schematic of serial connection of the present invention DCE-JFET integrated with a MOSFET device with the DCE-JFET providing reverse blocking capability to the MOSFET device, thus allowing it, for example, to be deployed as part of a battery charging circuit. The MOSFET-JFET device circuit representation 68 has a P-channel DCE-JFET circuit representation 38 serially connected to, at a common node 39, a P-channel MOSFET circuit representation 40. The MOSFET circuit representation 40 includes a built-in body diode 41 which is formed between the N-type MOSFET body region 52 and the P-type epitaxy layer 11b below. In addition to the common node 39, other externally accessible terminals are source terminal Terminal-S 58, drain terminal Terminal-D 20 and gate terminal Terminal-Gate 45.

FIG. 3B illustrates the cross sectional semiconductor die structure of an integrated P-channel trench gate MOSFET-JFET device die 66 corresponding to the circuit schematic of FIG. 3A. Thus, the MOSFET-JFET device die 66 includes two conduction terminals Terminal-S 58, Terminal-D 20 and a control terminal Terminal-Gate 45 (not visible in this cross section). The source electrode 20 of the DCE-JFET 10 also serves as the drain terminal Terminal-D of the overall circuit 68. Notice that the MOSFET-JFET device die 66 includes an additional fourth externally accessible terminal that is the P+ substrate region 11a. Laterally, the MOSFET-JFET device die 66 has a DCE-JFET device region 8 and a MOSFET device region 48. Thus, the CSSR 11 serially connects the MOSFET device drain region to the DCE-JFET device drain region from below. As mentioned before, the simplicity of internal vertical structural layers of the MOSFET-JFET device die 66 results directly from a corresponding similarity between the DCE-JFET 10 and the MOSFET 50 (FIG. 2A, FIG. 2B).

Other important aspects of the MOSFET-JFET device die 66 may include:
  The dopant material, concentration and depth of the MOSFET body regions 52 are selected to be the same as those of the DCE-JFET gate regions 14.
  The dopant material, concentration and depth of the MOSFET source regions 56 are selected to be the same as those of the DCE-JFET source regions 12.
  Material and thickness of the MOSFET top source electrode 58 (and top gate electrode) are selected to be the same as those of the top DCE-JFET electrode 20.

To those skilled in the art, these aspects will simplify the corresponding wafer manufacturing process of the MOSFET-JFET device die 66. That is, the JFET portion may be integrated onto a MOSFET without any additional manufacturing steps or masking steps.

FIG. 4 illustrates the deployment of the MOSFET-JFET device circuit representation 68 of FIG. 3A into a battery charging circuit 70. Here, the MOSFET-JFET device circuit representation 68 bridges the second charging terminal 74b of a battery charging source 74 to the second battery terminal 72b of a battery 72. More specifically, Terminal-S 58 connects to positive terminal 74b of battery charging source 74, Terminal-D 20 connects to positive terminal 72b of battery 72, and the negative terminal 72a of the battery connects to the negative terminal 74a of battery charging source 74.

FIG. 5A through FIG. 5C illustrate the operation principle of the integrated MOSFET-JFET device die 66 of FIG. 3B under various bias conditions. In FIG. 5A there is zero voltage bias between Terminal-S 58 and Terminal-D 20. Here, the conductivity level of the n-type DCE-JFET gate regions 14, the conductivity level of the p-type JFET channel element zones 28 between the DCE-JFET gate regions 14 and under the DCE-JFET source regions 12, and the DCE-JFET gate spacing GTSP 15 are all configured at their respectively predetermined levels such that:
  The JFET channel element zone 28 is depleted of current carriers by its two neighboring CSSR depletion zones 25

(the JFET channel element zone 28 is pinched shut at zero bias as this is an enhancement mode JFET). Thus, current conduction through the JFET channel element zone 28 is pinched shut by its two neighboring and overlapping depletion zones.

The net behavior of the MOSFET-JFET device die 66 near zero bias is to have very low current conduction as the equivalent variable JFET channel resistance 28 is very high and because there is near zero bias between Terminal-S 58 and Terminal-D 20.

In FIG. 5B there is forward voltage bias between Terminal-S and Terminal-D (Terminal-S at higher potential than Terminal-D). In this condition, the MOSFET can be turned on to allow charging of the battery 72 of FIG. 4, and the forward voltage bias results in a corresponding forward bias across the equivalent P-N junction diode elements 27 formed between the P-type epitaxy layer 11b and N-type DCE-JFET gate regions 14 that in turn shrinks the CSSR depletion zones 25 of FIG. 5A into CSSR depletion zones 25' of FIG. 5B. Here, the conductivity level of the DCE-JFET gate regions 14, the conductivity level of the JFET channel element zones 28' between the DCE-JFET gate regions 14 and under the DCE-JFET source regions 12, and the DCE-JFET gate spacing GTSP 15 are all configured at their respectively pre-determined levels such that:

The JFET channel element zone 28 of FIG. 5A is now opened up into JFET channel element zone 28' with current carriers for electrical conduction as the shrunk CSSR depletion zones 25' are now separated from each other.

While at lower voltages, the JFET channel element zone 28 might still be closed or only partially open, with increasing voltages the JFET channel element zone 28' opens up more fully, allowing more current flow. Owing to the current shunting ability of the JFET channel element zones 28', the net behavior of the MOSFET-JFET device die 66 under a forward bias is, referring to the DCE-JFET equivalent circuit 36 of FIG. 1B, a DCE-JFET 10 with a forward turn on voltage Vf substantially lower than that of a PN junction diode as the equivalent variable JFET channel resistance 28 can be made very low at a low forward voltage bias. While the P-N diodes 27 conduct only a little at lower voltages, at higher voltages (e.g. above ~0.7V) the P-N diodes 27 conduct much more, increasing the current capacity of the device. By way of example, the present invention DCE-JFET 10 can be made with a Vf in the range of 0.3V-0.5V, substantially lower than 0.7V-1V of a traditional PN junction diode. The doping concentrations of the JFET gate regions 14, the JFET channel element zones 28 and the DCE-JFET gate spacing GTSP 15 determine the forward voltage Vf of the device.

In FIG. 5C there is reverse voltage bias between Terminal-S 58 and Terminal-D 20 (Terminal-S at lower potential than Terminal-D). By way of example, this scenario can happen in the battery charging circuit of FIG. 4 if the battery charging source 74 becomes shorted out with the battery 72 still connected. Note that in this state, even with the MOSFET 40 turned off, the MOSFET built-in body diode 41 (formed between n-type body region 52 and p-type epitaxy layer 11b) is forward biased and allows conduction across the MOSFET 40, thus necessitating a reverse blocking element, which is now provided by the DCE-JFET 38. The reverse bias results in a corresponding reverse bias across the equivalent P-N junction diode elements 27 that in turn expands the CSSR depletion zones 25 of FIG. 5A into CSSR depletion zones 25" of FIG. 5C further pinching off the JFET channel element zones into JFET channel element zones 28", and making any current flow very low. Therefore, the net leakage current behavior of the MOSFET-JFET device die 66 under reverse bias is, referring to the DCE-JFET equivalent circuit 36 of FIG. 1B, similar to that of the equivalent P-N junction diode 27 as the equivalent variable JFET channel resistance 28 is even higher than that of FIG. 5A. By way of example, the present invention DCE-JFET 10 can be made with a reverse leakage current in the range of 0.1 nA-100 nA, comparable to that of a PN junction diode.

As an important remark summarizing the above descriptions of FIG. 5A through FIG. 5C, the equivalent JFET channel resistance of each of the JFET channel element zones 28 is controlled by a bias voltage across the P epitaxial region 11a and Terminal-D. Specifically, a higher bias voltage results in a lower equivalent JFET channel resistance.

FIG. 6A is a circuit schematic of serial connection of the present invention DCE-JFET and a MOSFET device that by way of example can be deployed as part of a battery charging circuit. The MOSFET-JFET device circuit representation 68 has a P-channel DCE-JFET circuit representation 38 serially connected to, at a common node 39, a P-channel MOSFET circuit representation 40. Externally accessible terminals of circuit 68 may include Terminal-S 58, Terminal-D 20 and Terminal-Gate 45, and optionally, common node 39. FIG. 6B illustrates the cross sectional semiconductor die structure of an integrated P-channel planar gate MOSFET-JFET device die 69 corresponding to the circuit schematic 68 of FIG. 6A. The various MOSFET planar gate regions 84 are located over the N-type MOSFET body regions 52 and bridging the P-type MOSFET source regions 56 to the p-epitaxy region 11b. Comparing FIG. 6B with FIG. 3B reveals that, except for the replacement of MOSFET trenched gate regions 54 with MOSFET planar gate regions 84, the MOSFET-JFET device die 69 is structurally very similar to the MOSFET-JFET device die 66.

Although the above examples show a P-channel MOSFET and a P-channel JFET, these examples can easily be applied to the opposite conductivity type, e.g. N-channel MOSFET with an N-channel JFET, by switching the conductivity types of each of the semiconductor regions. FIG. 7A is a circuit schematic of serial connection of the present invention DCE-JFET and a MOSFET device that by way of example can be deployed as part of a battery charging circuit. The MOSFET-JFET device circuit representation 78 has an N-channel DCE-JFET circuit representation 88 serially connected to, at a common node 39, an N-channel MOSFET circuit representation 90. Externally accessible terminals of the circuit 78 may include Terminal-S 58, Terminal-D 20 and Terminal-Gate 45, and optionally, common node 39. FIG. 7B illustrates the cross sectional semiconductor die structure of an integrated trench gate N-channel MOSFET-JFET device die 86 corresponding to the circuit schematic of FIG. 7A. A quick comparison between FIG. 3B and FIG. 7B reveals that, except for the interchange between semiconductor conductivity types (P-type vs. N-type), the structural topology of MOSFET-JFET device die 86 is the same as MOSFET-JFET device die 66.

FIG. 8A through FIG. 8V illustrate a fabrication process for the MOSFET-JFET device die 66 of FIG. 3B. As illustrated in FIG. 8A and FIG. 8B, a CSSR 11 is provided with its major plane partitioned into a MOSFET device region 48 and a DCE-JFET device region 8. In this case, the CSSR 11 includes an upper p-epitaxy region 11b of lower conductivity located on top of a lower p+ substrate region 11a of higher conductivity. As a remark, the p-epitaxy region 11b can be formed on top of the p+ substrate region 11a. A number of MOSFET gate trenches 100 are then formed into the CSSR 11 by, for example:

Form a trench mask (not shown here) upon the CSSR 11 that corresponds to the MOSFET gate regions in the MOSFET device region 48 whereas the trench mask covers up the CSSR 11 in the DCE-JFET device region 8.

Anisotropically etch, through the trench mask, the CSSR 11 to form the MOSFET gate trenches 100 then remove the trench mask.

FIG. 8C through FIG. 8F illustrate the fabrication of a MOSFET trench gate region 108 in the MOSFET device region 48 of FIG. 2B. In FIG. 8C and FIG. 8D, a gate dielectric layer 102, for example gate oxide, is formed in the gate trenches 100 of the MOSFET device region 48 and also formed upon the other exposed surfaces of CSSR 11 in the MOSFET device region 48 and DCE-JFET device region 8. In FIG. 8E and FIG. 8F, the MOSFET trench gate region 108 is then formed by depositing a conductive gate layer 109 onto the gate dielectric layer 102. The conductive gate layer can be, for example, a properly doped polysilicon.

FIG. 8G through FIG. 8H illustrate the simultaneous separation of the conductive gate layer 109 into elemental MOSFET gate regions 54 while removing the conductive gate layer 109 from the top surface of the CSSR 11. This can be done by anisotropically etching back the conductive gate layer 109 till the MOSFET gate region 108 separates into the elemental MOSFET gate regions 54. The MOSFET device region 48 and the DCE-JFET device region 8 may then optionally be covered, for example through an oxidation process, with a screen oxide 110.

FIG. 8I through FIG. 8L illustrate the simultaneous creation of:
- MOSFET body regions 52 beneath the optional screen oxide 110 of the MOSFET device region 48.
- DCE-JFET gate regions 14 beneath the optional screen oxide 110 of the DCE-JFET device region 8.

In FIG. 8I and FIG. 8J, first (N-type) MOSFET implantation regions 120 in the MOSFET device region 48 and first (N-type) DCE-JFET implantation regions 126 in the DCE-JFET device region 8 are simultaneously made beneath the screen oxide 110 with a first implantation mask (not shown). In FIG. 8K and FIG. 8L, all the first MOSFET implantation regions and first DCE-JFET implantation regions are simultaneously and respectively diffused and activated, for example through a high temperature diffusion cycle, into the N-type MOSFET body regions 52 and the N-type DCE-JFET gate regions 14.

FIG. 8M through FIG. 8P illustrate the simultaneous creation of:
- MOSFET source regions 56 beneath the optional screen oxide 110 of the MOSFET device region 48.
- DCE-JFET source regions 12 beneath the optional screen oxide 110 of the DCE-JFET device region 8.

In FIG. 8M and FIG. 8N, second (N-type) MOSFET implantation regions 130 in the MOSFET device region 48 and second (N-type) DCE-JFET implantation regions 136 in the DCE-JFET device region 8 are simultaneously made beneath the screen oxide 110 with a second implantation mask (not shown). In FIG. 8O and FIG. 8P, all the second MOSFET implantation regions and second DCE-JFET implantation regions are simultaneously and respectively diffused and activated, for example through a high temperature diffusion cycle, into the MOSFET source regions 56 and the DCE-JFET source regions 12. While formation of the MOSFET source regions 56 and DCE-JFET source regions 12 do not need to be performed simultaneously, it can be advantageous to do so to reduce the number of processing steps and masks needed; the same holds true for the formation of the MOSFET body regions 52 and DCE-JFET gate regions 14.

FIG. 8Q through FIG. 8T illustrate the formation and patterning of top passivation layers 57 with top contact openings 142 upon the MOSFET device region 48. In FIG. 8Q and FIG. 8R, a low temperature oxide/borophosphosilicate glass (LTO/BPSG) dual passivation layer 140 is formed and densified upon the MOSFET device region 48 and the DCE-JFET device region 8. In FIG. 8S and FIG. 8T, the formed dual passivation layer 140 is patterned, through a top passivation mask (not shown here), such that:
- The portion of formed dual passivation layer 140 in the DCE-JFET device region 8 is removed.
- The portion of formed dual passivation layer 140 in the MOSFET device region 48 is patterned into the desired top passivation layers 57 with top contact openings 142 matching top portions of the MOSFET body regions 52, top of the MOSFET source regions 56 while covering the top of the MOSFET gate regions 54.

FIG. 8U and FIG. 8V illustrate the formation and patterning of a top source electrode 58 in the MOSFET device region 48 and a top DCE-JFET electrode 20 in the DCE-JFET device region 8. This involves:
- Deposit a top metal layer upon the MOSFET device region 48 and the DCE-JFET device region 8.
- Pattern the formed top metal layer, through a top metal mask (not shown), such that:
  - The portion of patterned top metal layer in the MOSFET device region 48 corresponds to the desired top source electrode 58 and top gate electrode (not visible in this cross section).
  - The portion of patterned top metal layer in the DCE-JFET device region 8 corresponds to the desired top DCE-JFET electrode 20.

Given the above detailed description of fabrication process (FIG. 8A through FIG. 8V) for the trench gate MOSFET-JFET device die 66 and small structural difference between trench gate MOSFET and planar gate MOSFET (compare FIG. 3B and FIG. 6B), the fabrication process for the planar gate MOSFET-JFET device die 69 is quite similar to that for the trench gate MOSFET-JFET device die 66 with the following remarks for the planar gate MOSFET-JFET device die 69:
- Form conductive gate layer over a gate dielectric layer in the MOSFET region and in the DCE-JFET region upon the CSSR top surface.
- Simultaneously separate the conductive gate layer into elemental MOSFET gate regions which involves:
  - Form a gate mask on the top of conductive gate layer that corresponds to the MOSFET gate regions in the MOSFET region whereas that exposes the conductive gate layer in the DCE-JFET region.
  - Etch back, through the gate mask, the conductive gate layer and the gate dielectric layer till the conductive gate layer separates into elemental MOSFET gate regions and complete disappearance of the conductive gate layer in the DCE-JFET region then remove the gate mask.

Formation of a MOSFET planar gate is a mature technology and very well known to those skilled in the art. In addition, though the above process shows how to form an integrated P-channel MOSFET with a P-channel JFET, the process may be followed to form an integrated N-channel MOSFET with an N-channel JFET, by reversing the conductivity types of the semiconductor regions described.

Finally, and specially for the purpose of clarifying the spatial location of the top gate electrode of the MOSFET-JFET device die 66 of FIG. 3B, FIG. 9 illustrates a simplified top view of a MOSFET-JFET device die 66a that has the integrated MOSFET device and the diode-connected JFET of this invention like that shown in FIG. 3B. The MOSFET device region 48 shows a top source electrode 58 and a top gate electrode 45 whereas the DCE-JFET device region 8 shows a top DCE-JFET electrode 20.

While the description above contains many specificities, these specificities should not be construed as accordingly limiting the scope of the present invention but as merely providing illustrations of numerous presently preferred embodiments of this invention. For example, this invention can be applied to integrated circuit (IC) chips as well as to discrete power chips. The term 'terminal' refers to a node in a circuit. The term 'electrode' can be any sort of metal connection. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. A battery charging circuit comprising:
   a battery having a first battery terminal and a second battery terminal;
   a battery charging source having a first charging terminal and a second charging terminal with the first charging terminal connected to the first battery terminal;
   a serial connection of a MOSFET and an enhancement mode JFET for bridging the second charging terminal to the second battery terminal, wherein the enhancement mode JFET is configured with its JFET source shorted to its JFET gate thus functions as a reverse blocking diode having a low forward voltage drop.

2. The battery charging circuit of claim 1 wherein,
   The MOSFET and the enhancement mode JFET are integrated on a semiconductor die.

3. The battery charging circuit of claim 2 wherein
   the semiconductor die comprising:
   a lower common semiconductor substrate region (CSSR) of type-1 conductivity;
   a MOSFET device region, located at the top of the CSSR, having:
   the CSSR as its MOSFET drain region;
   at least a MOSFET body region of type-2 conductivity, a MOSFET gate region and a MOSFET source region of type-1 conductivity located at the top of the MOSFET drain region.

4. The battery charging circuit of claim 3 wherein
   the semiconductor die further comprising:
   a diode-connected enhancement mode JFET (DCE-JFET) device region, located at the top of the CSSR, having:
   the CSSR as its DCE-JFET drain region;
   at least two DCE-JFET gate regions of type-2 conductivity located at the top of the DCE-JFET drain region and laterally separated from each other along the major CSSR plane with a DCE-JFET gate spacing;
   at least a DCE-JFET source region of type-1 conductivity located at the top of the CSSR and between the DCE-JFET gate regions, wherein the DCE-JFET source region is shorted to the DCE-JFET gate regions; and
   whereby the CSSR serially connects the MOSFET device drain region to the DCE-JFET device drain region.

5. The battery charging circuit of claim 4 wherein said semiconductor device die further comprises:
   two conduction nodes Terminal-S and Terminal-D;
   a source electrode connected to the MOSFET source region as the Terminal-S; and
   a DCE-JFET electrode in contact with said DCE-JFET gate regions and DCE-JFET source regions, as the Terminal-D.

6. The battery charging circuit of claim 4 wherein said MOSFET-JFET semiconductor device die is connected to a battery and to a battery charging source in a battery charging circuit.

7. The battery charging circuit of claim 4 wherein conductivity level of the DCE-JFET gate regions, conductivity level of a DCE-JFET channel region between the DCE-JFET gate regions and under the DCE-JFET source region, and DCE-JFET gate spacing are all configured at their respectively pre-determined levels whereby making the DCE-JFET device exhibit a low forward voltage Vf and a low reverse leakage current as a diode-connected enhancement mode JFET.

8. The battery charging circuit of claim 7 wherein said Vf is substantially lower than that of a PN junction diode while said reverse leakage current is comparable to that of a PN junction diode.

9. The battery charging circuit of claim 4 wherein:
   the dopant material, concentration and depth of the MOSFET body regions are selected to be the same as those of the DCE-JFET gate regions; and
   the dopant material, concentration and depth of the MOSFET source regions are selected to be the same as those of the DCE-JFET source regions
   whereby simplifying its manufacturing process.

10. The battery charging circuit of claim 5 wherein material and thickness of the MOSFET source electrode is selected to be the same as those of the DCE-JFET electrode whereby simplifying its manufacturing process.

11. The battery charging circuit of claim 4 wherein said MOSFET gate regions are configured as trench gates extending downwards into the MOSFET body regions and the CSSR.

12. The battery charging circuit of claim 4 wherein said MOSFET gate regions are configured as planar gates located over the MOSFET body regions and bridging the MOSFET source regions to the CSSR.

13. The battery charging circuit of claim 4 where said CSSR comprises an upper layer of lower type-1 conductivity atop a lower substrate layer of higher type-1 conductivity.

14. The battery charging circuit of claim 4 wherein said type-1 conductivity is P-type and said type-2 conductivity is N-type whereby making the MOSFET-JFET semiconductor device die a P-channel device.

15. The battery charging circuit of claim 4 wherein said type-1 conductivity is N-type and said type-2 conductivity is P-type whereby making the MOSFET-JFET semiconductor device die an N-channel device.

16. The battery charging circuit of claim 1 wherein the semiconductor device die is a discrete power device.

* * * * *